(12) United States Patent
Saito et al.

(10) Patent No.: US 7,575,150 B2
(45) Date of Patent: Aug. 18, 2009

(54) FLUX COMPOSITION FOR SOLDER, SOLDER PASTE, AND METHOD OF SOLDERING

(75) Inventors: Shun Saito, Chita-Gun (JP); Katsumi Nakasato, Handa (JP); Yukihiro Kato, Chita-Gun (JP); Isao Nakata, Obu (JP)

(73) Assignee: NOF Corporation, Tokyo (JP)

( * ) Notice: Subject to any disclaimer, the term of this patent is extended or adjusted under 35 U.S.C. 154(b) by 161 days.

(21) Appl. No.: 11/860,395

(22) Filed: Sep. 24, 2007

(65) Prior Publication Data

US 2008/0073414 A1 Mar. 27, 2008

Related U.S. Application Data

(62) Division of application No. 10/491,011, filed as application No. PCT/JP02/09946 on Sep. 26, 2002, now abandoned.

(30) Foreign Application Priority Data

| Sep. 26, 2001 | (JP) | ............................ 2001-295165 |
| Jan. 25, 2002 | (JP) | ............................ 2002-016301 |
| Jan. 25, 2002 | (JP) | ............................ 2002-016302 |
| Mar. 29, 2002 | (JP) | ............................ 2002-093702 |
| Mar. 29, 2002 | (JP) | ............................ 2002-097483 |

(51) Int. Cl.
*B23K 31/02* (2006.01)
(52) U.S. Cl. .................. 228/180.22; 228/207; 228/223; 228/224; 228/248.1
(58) Field of Classification Search .................. None
See application file for complete search history.

(56) References Cited

U.S. PATENT DOCUMENTS 4,140,554 A 2/1979 Stayner et al.
4,278,479 A 7/1981 Anderson et al.
4,960,236 A 10/1990 Hedges et al.
5,064,481 A 11/1991 Davis et al.
5,417,771 A 5/1995 Arita et al.
5,741,622 A * 4/1998 Arima ..................... 430/270.1
5,932,031 A 8/1999 Hamilton et al.
5,993,909 A 11/1999 Mizutani et al.
6,059,894 A 5/2000 Pendse
6,103,387 A 8/2000 Yamamoto et al.
6,211,320 B1 * 4/2001 Dershem et al. ......... 526/329.1

(Continued)

FOREIGN PATENT DOCUMENTS

EP 1059323 12/2000

(Continued)

*Primary Examiner*—Kiley Stoner
(74) *Attorney, Agent, or Firm*—Darby & Darby P.C.

(57) ABSTRACT

Soldering flux compositions, solder pastes, and methods of soldering using the same are provided, that exhibit excellent wettability, give highly reliable solder joints, and have superior storage stability. The flux composition contains at least one compound having at least one blocked carboxyl group selected from the group including compound (X) obtained by reaction of a carboxylic acid compound and a vinyl ether compound, compound (Y) obtained by reaction of a carboxylic acid anhydride compound and a hydroxy vinyl ether compound, and compound (Z) obtained by reaction of an acid anhydride and a polyhydric alcohol, followed by addition polymerization with a divinyl ether compound, and the flux composition is non-curing.

15 Claims, 3 Drawing Sheets

U.S. PATENT DOCUMENTS

| | | |
|---|---|---|
| 6,214,956 B1 | 4/2001 | Plochocka |
| 6,399,277 B1 * | 6/2002 | Nojima et al. ............ 430/280.1 |
| 6,403,670 B1 | 6/2002 | Ishidoya et al. |
| 6,599,372 B2 | 7/2003 | Arora et al. |
| 6,617,046 B2 * | 9/2003 | Noro et al. ................... 428/620 |
| 6,667,194 B1 * | 12/2003 | Crane et al. ................. 438/127 |
| 7,009,009 B1 * | 3/2006 | Crane et al. ................. 525/533 |
| 2002/0151106 A1 * | 10/2002 | Noro et al. ................... 438/118 |
| 2003/0082355 A1 * | 5/2003 | Iwaida et al. ................ 428/209 |
| 2003/0219619 A1 * | 11/2003 | Noro et al. ................... 428/620 |
| 2004/0048950 A1 | 3/2004 | Nishida et al. |
| 2004/0129344 A1 | 7/2004 | Arita et al. |
| 2004/0170587 A1 * | 9/2004 | Vondruska ............... 424/70.12 |
| 2005/0032946 A1 * | 2/2005 | Salvin et al. ................ 524/186 |
| 2006/0019077 A1 * | 1/2006 | Hopper et al. .............. 428/209 |
| 2006/0272747 A1 * | 12/2006 | Wang et al. .................... 148/23 |
| 2007/0095432 A1 * | 5/2007 | Musa .......................... 148/23 |
| 2007/0240792 A1 * | 10/2007 | Witteler et al. .............. 148/250 |
| 2007/0277907 A1 * | 12/2007 | Musa .......................... 148/23 |
| 2008/0023108 A1 * | 1/2008 | Wang et al. .................... 148/23 |

FOREIGN PATENT DOCUMENTS

| | | |
|---|---|---|
| JP | 2025291 | 1/1990 |
| JP | 2290693 | 11/1990 |
| JP | 05-212584 A1 | 8/1993 |
| JP | 07-164183 A1 | 6/1995 |
| JP | 10-305391 A1 | 11/1998 |
| JP | 2004-042786 A1 | 2/2000 |
| JP | 2001239395 | 9/2001 |

\* cited by examiner

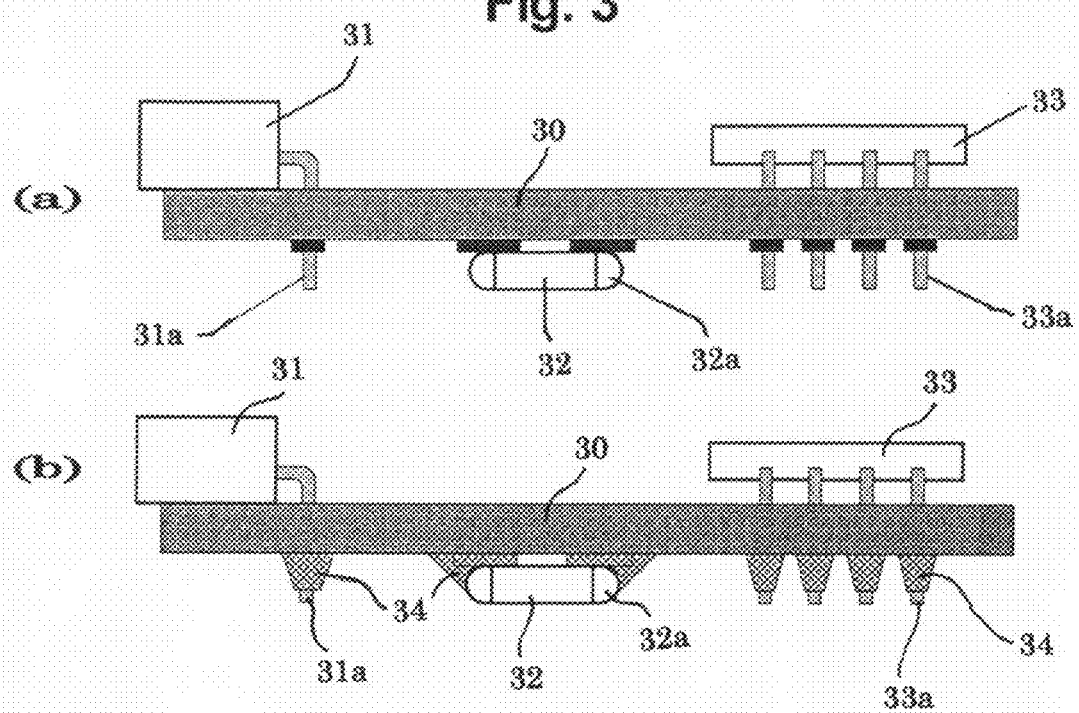
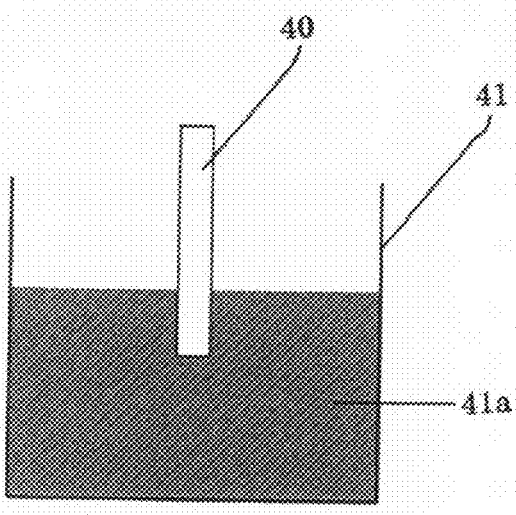

FLUX COMPOSITION FOR SOLDER, SOLDER PASTE, AND METHOD OF SOLDERING

This is a divisional of U.S. patent application Ser. No. 10/491,011, filed Mar. 24, 2004 now abandoned, which is a U.S. National Phase application under 35 U.S.C. §371 of International Application No. PCT/JP02/09946, filed Sep. 26, 2002, which claims the benefit of Japanese Patent Application Nos. 2001-295165 filed Sep. 26, 2001, 2002-16301 filed Jan. 25, 2002, 2002-16302 filed Jan. 25, 2002, 2002-93702 filed Mar. 29, 2002, 2002-97483 filed Mar. 29, 2002. Each of these applications is hereby incorporated in its entirety by reference.

FIELD OF ART

The present invention relates to a flux composition, a solder paste, and a method of soldering, used in mounting electronic components on a printed circuit board or in soldering hybrid ICs (HICs).

BACKGROUND ART

Electronic components are mounted on printed circuit boards mostly by soldering. Common soldering includes, prior to application of a solder, removal with a flux of the oxide film on a metal surface to be jointed, and cleaning, or alternatively is implemented using a solder paste containing solder powder in mixture with a flux.

Soldering fluxes are required to be highly insulative, non-corrosive, stable for a long time, and noncausative of material property change of other parts, for maintaining good properties and reliability of the resulting products. On the other hand, for good workability, soldering fluxes are also required not to generate toxic gases, to give good solder ability by removing oxides from and covering the metal surface and by lowering the surface tension of molten solder, not to be tacky, and to be easy to remove by cleaning.

A flux usually contains a resin, an activator, a solvent, and other additives, and is usually used by applying the flux to a surface of a metal substrate, or by soaking the substrate in the flux. A solder paste is a viscous paste made of a solid or liquid flux and solder powder kneaded together. The flux in a solder paste usually contains a rosin compound, a thixotropic agent, an activator, a solvent, and a dispersion stabilizer. As the base resin for the flux, a rosin compound is used, such as natural rosin, polymerized rosin, hydrogenated rosin, or disproportionated rosin. As the activator for the flux, an organic acid is used, such as adipic, sebacic, or citric acid.

The carboxyl groups in the rosin compound and in the organic acid as an activator in the flux, function to remove metal oxides on a metal surface to effectively improve solder ability. However, such carboxyl groups form a post-solder residue, which adversely affects the reliability after soldering due to its ionic and mechanical effects. In a solder paste containing a flux, the carboxyl groups also adversely affect the storage stability of the solder paste per se. Specifically, the flux component in a recent lead-free solder necessarily contains a relatively strong activator in a large amount for compensating for inferior wettability of the lead-free solder. However, such increased activity or amount of the activator impairs the reliability of the solder joint, as well as the storage stability of the solder paste. Thus wettability required for the flux and the solder paste, and other necessary properties such as reliability and storage stability are conflicting with each other, and all of these requirements are hard to be fulfilled at the same time. Further, the kind and amount of the activator need to be strictly limited.

As a flux remover, fluorinated or chlorinated solvents have been in use, but their use is being limited for their impact on the environment. Hydrocarbon and alcohol solvents have also been in use, with problems in toxicity and inflammability. In this sense, water is the most preferable defluxer, but no flux or solder paste has been available that is sufficiently cleaned with water. When a flux is to be cleaned with water, the non-volatile components of the flux must be water-cleanable, and even the volatile solvent is preferably water-cleanable, since a part of the solvent may be left over through the reflow. In general, rosin compounds used as a base resin for the flux component is hardly water-cleanable, and thus not usable in a flux to be cleaned with water.

On the other hand, low-residue, no-clean fluxes with a low solid content are commercially available. However, reliability of such no-clean fluxes is not yet sufficient when a resin molding or wire bonding process is to follow. Commercially available no-clean solder pastes are designed to have a lower solid content or no halide content, yet inevitably leave post-solder residues derived from the resin component such as rosin or the activator component. The residue from the activator particularly has serious impact on the reliability. On the contrary, the residue from the resin, such as rosin, does not have a serious effect on the soldering of most printed circuit boards for consumer electric appliances and some kind of vehicle on-board printed circuit boards. However, in soldering HICs, even a little residue will give rise to terminal leakage or circuit corrosion of flip chips, leading to problems in the reliability in the following wire bonding step.

For solving such problems, JP-2-290693-A and JP-2-25291-A propose a soldering method that leaves no residue, including reflowing a solder paste with alcohol. The former discloses a paste containing solder powder mixed with alcohols, such as monohydric alcohols, polyhydric alcohols, or ethers, with a boiling point about 30° C. higher than the melting point of the solder. This solder paste may be a residueless material, but may not be expected to have good wettability under a non-reducing atmosphere or at an ordinary reflow temperature.

JP-2001-239395-A proposes a thermosetting soldering flux containing compound (A) having one or more blocked carboxyl groups in a molecule, and compound (B) having two or more reactive functional groups in a molecule capable of forming chemical bonds with carboxyl groups by heating. However, since this flux contains the requisite compound (B) having two or more reactive functional groups, the compound (A) having one or more blocked carboxyl groups is cured by thermal crosslinking. Thus this flux is a no-clean flux leaving a thermoset product, and thus is totally different from a flux requiring cleaning, or a no-clean, non-curing flux leaving substantially no residue, in its reaction, effects, and required properties.

SUMMARY OF THE INVENTION

It is an object of the present invention to provide a soldering flux composition and a solder paste that exhibit excellent wettability, give highly reliable solder joints, and have superior storage stability.

It is another object of the present invention to provide a soldering flux composition and a solder paste that exhibit excellent wettability even under a non-reducing atmosphere or at an ordinary reflow temperature, give highly reliable solder joints, and have superior storage stability.

It is yet another object of the present invention to provide a method of soldering that enables easy application of solder that exhibits excellent wettability and gives highly reliable solder joints.

According to the present invention, there is provided a soldering flux composition comprising at least one compound having at least one blocked carboxyl group (sometimes referred to as compound (A) hereinbelow) selected from the group consisting of:

compound (X) obtained by reaction of a carboxylic acid compound and a vinyl ether compound;

compound (Y) obtained by reaction of a carboxylic acid anhydride compound and a hydroxy vinyl ether compound; and compound (Z) obtained by reaction of an acid anhydride and a polyhydric alcohol, followed by addition polymerization with a divinyl ether compound, wherein said soldering flux composition is non-curing.

According to the present invention, there is also provided a solder paste comprising the above-mentioned soldering flux composition and solder powder.

According to the present invention, there is further provided a method of soldering comprising the steps of:

(A) providing the above-mentioned flux composition on an electrode portion of a substrate;

(B) providing a solder bumped electronic component;

(C) placing said electronic component provided in step (B) on said substrate obtained in step (A); and (D1) subjecting said substrate with the electronic component obtained in step (C) to reflow for mounting.

According to the present invention, there is also provided a method of soldering comprising step (A) mentioned above, and step (D2) of supplying solder onto said substrate with the flux composition obtained in step (A), by flowing or dipping.

According to the present invention, there is further provided a method of soldering comprising the steps of:

(X) printing the above solder paste on an electrode portion of a substrate;

(Y) placing an electronic component on said substrate obtained in step (X); and (Z) subjecting said substrate with the electronic component to reflow for mounting.

BRIEF DESCRIPTION OF THE DRAWINGS

FIG. 3 is an explanatory schematic view illustrating the method of soldering by flow soldering in the flow step in Example 3-2.

FIG. 4 is an explanatory schematic view illustrating the method of soldering performed in Example 3-3.

PREFERRED EMBODIMENTS OF THE INVENTION

Figure 1:
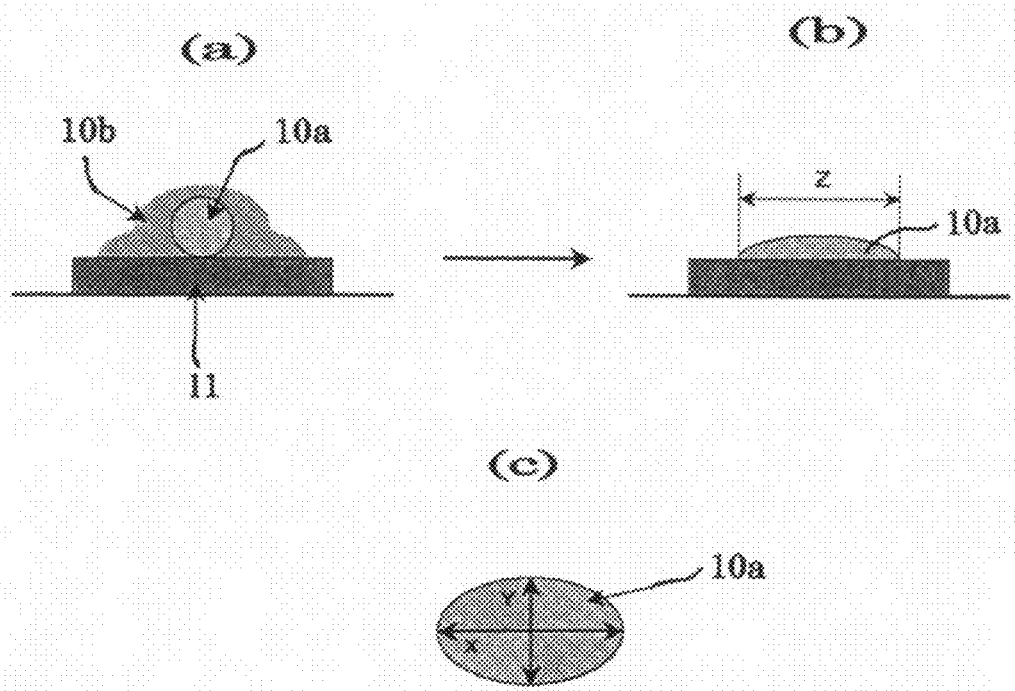
FIG. 1 is an explanatory view illustrating the process for measuring solder ball spread performed in Examples.

The present invention will now be explained in detail.

The flux composition according to the present invention is a non-curing composition that contains compound (A) having at least one blocked carboxyl group, and is free from a compound having two or more reactive functional groups in a molecule capable of forming chemical bonds with carboxyl groups.

The compound (A) contains at least one compound selected from the group consisting of compound (X) obtained by reaction of a carboxylic acid compound and a vinyl ether compound, compound (Y) obtained by reaction of a carboxylic acid anhydride compound and a hydroxy vinyl ether compound, and compound (Z) obtained by reaction of an acid anhydride and a polyhydric alcohol, followed by addition polymerization with a divinyl ether compound.

Compound (X) may be a compound represented by the formula (1) or (2) below, wherein all the carboxyl groups are shown blocked, but some may be left unblocked, as long as the objects of the present invention are achieved.

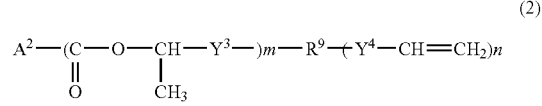

In the formula (1), x is an integer of 1 to 6, $A^1$ stands for a carboxyl acid residue without $—(COO—)_x$, and $Z^1$ stands for the formula (1-1) or (1-2):

wherein $R^1$, $R^2$, $R^3$, $R^5$, and $R^6$ each independently stands for a hydrogen atom or an organic group having 1 to 50 carbon atoms, $R^4$, $R^7$, and $R^8$ each independently stands for an organic group having 1 to 50 carbon atoms, and $Y^1$ and $Y^2$ each independently stands for an oxygen or sulfur atom. In the formula (2), $A^2$ stands for a carboxylic acid residue without $—(COO—)_m$, $Y^3$ and $Y^4$ each independently stands for an oxygen or sulfur atom, $R^9$ stands for an organic group having 1 to 50 carbon atoms, m is an integer of 1 to 6, and n is an integer of 0 to 5.

The carboxylic acid compound as a starting material for compound (X) may be selected from monovalent aliphatic carboxylic acids, divalent or higher polyvalent aliphatic carboxylic acids, monovalent aromatic carboxylic acids, and divalent or higher polyvalent aromatic carboxylic acids, with rosins and aliphatic dicarboxylic acids being particularly preferred.

Examples of the carboxylic acid compound may include aliphatic carboxylic acids, such as dicarboxylic acids including oxalic, malonic, succinic, adipic, glutaric, 2,4-diethylglutaric, 2,4-dimethylglutaric, pimelic, azelaic, sebacic, cyclohexanedicarboxylic, maleic, fumaric, and diglycolic acids, fatty acids including caprylic, lauric, myristic, palmitic, stearic, arachic, behenic, linoleic, oleic, and linolenic acids, and hydroxycarboxylic acids including lactic, hydroxypivalic, dimethylolpropionic, citric, malic, and glyceric acids; aromatic carboxylic acids such as benzoic, phthalic, isophthalic, trimellitic, and pyromellitic acids; and rosin compounds such as natural rosins, polymerized rosins, hydrogenated rosins, disproportionated rosins, and partially modified rosins. Among these, natural and polymerized rosins, succinic, adipic, sebacic, glutaric, and 2,4-diethylglutaric acids are preferred for their rheology, activity, and reliability.

The vinyl ether compound as a starting material for compound (X) may be selected from aliphatic vinyl ethers, aliphatic vinyl thioethers, cyclic vinyl ethers, and cyclic vinyl thioethers.

Examples of the aliphatic vinyl ethers may include monovinyl ether compounds such as methyl, ethyl, isopropyl, n-propyl, n-butyl, isobutyl, 2-ethylhexyl, and cyclohexyl vinyl ethers; divinyl ether compounds such as butanediol, cyclohexanediol, cyclohexanedimethanol, diethyleneglycol, triethyleneglycol, tetraethyleneglycol, ethyleneglycol, and hexanediol divinyl ethers; trivinyl ether compounds such as trimethylolpropane trivinyl ether; and tetravinyl ether compounds such as pentaerythritol tetravinyl ether. Examples of the aliphatic vinyl thioethers may include thio compounds corresponding to the above examples of the aliphatic vinyl ethers.

Examples of the cyclic vinyl ethers may include 2,3-dihydrofuran, 3,4-dihydrofuran, 2,3-dihydro-2H-pyran, 3,4-dihydro-2H-pyran, 3,4-dihydro-2-methoxy-2H-pyran, 3,4-dihydro-4,4-dimethyl-2H-pyran-2-one, 3,4-dihydro-2-ethoxy-2H-pyran, and 3,4-dihydro-2H-pyran-2-sodium carboxylate. Examples of the cyclic vinyl thioethers may include thio compounds corresponding to the above examples of the cyclic vinyl ethers.

Among the above examples, n-propyl, n-butyl, 2-ethylhexyl vinyl ethers, and 1,4-butanediol divinyl ether are preferred for their ready availability and the decomposition point of the resulting compound (X). The vinyl ethers may be compounds represented by the formula (5), (6), or (7):

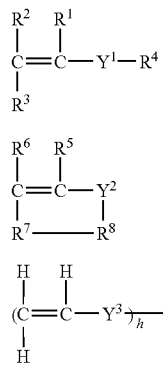

wherein $R^1$ to $R^8$ and $Y^1$ to $Y^3$ are the same as above, $R^9$ stands for a residue derived from a polyfunctional vinyl ether compound, and h is an integer of 2 to 8.

For producing a flux cleanable with an organic solvent, compound (X) in the present flux composition may be prepared from any of the carboxylic acid compounds and any of the vinyl ether compounds as the starting materials. For producing a water-cleanable flux, compound (X) in the flux composition may be prepared from a water-soluble carboxylic acid compound and any of the vinyl ether compounds as the starting materials, since the latter is to be volatized and thus imposes no limitation. For producing a no-clean flux, compound (X) in the flux composition may be prepared from a carboxylic acid compound having a boiling point of not higher than 300° C. and any of the vinyl ether compounds as the starting materials, since the latter is to be volatized and thus imposes no limitation. Further, for producing a no-clean flux from the present flux composition containing a compound having one reactive functional group in a molecule capable of forming a chemical bond with a carboxyl group upon heating, as will be discussed later, compound (X) in the flux composition may be prepared from any of the carboxylic acid compounds and any of the vinyl ether compounds as the starting materials.

For preparing compound (X), the carboxylic acid compound and the vinyl ether compound may be reacted, for example, at a reaction temperature of 30 to 200° C., preferably 50 to 150°, for a duration of 10 minutes to six hours, preferably 20 minutes to 5 hours. The end point of the reaction may preferably be, for example, when the acid number of the reaction system is determined to be not larger than 5 mgKOH/g. Accordingly, the acid number of the reaction product is preferably not larger than 5 mgKOH/g. It is particularly preferred to perform the reaction so that all of the carboxyl groups in compound (X) are blocked, but some of the carboxyl groups may be left unblocked, as long as the objects of the present invention are achieved.

In the above-mentioned reaction, an acid catalyst may be used for promoting the reaction. Further, an organic solvent may also be used for homogenizing the reaction system to facilitate the reaction.

The acid catalyst for promoting the reaction may be, for example, an acidic phosphate represented by the formula (8):

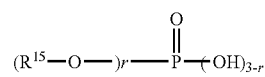

wherein $R^{15}$ stands for an alkyl, cycloalkyl, or aryl group having 3 to 10 carbon atoms, and r is 1 or 2. Examples of the acidic phosphate may include mono- or diesters of phosphoric acid and a primary alcohol such as n-propanol, n-butanol, n-hexanol, n-octanol, or 2-ethylhexanol, or a secondary alcohol such as isopropanol, 2-butanol, 2-hexanol, 2-octanol, or cyclohexanol. As the acid catalyst, one or a combination of two or more of the above may be used.

Examples of the organic solvent for homogenizing the reaction system to facilitate the reaction may include aromatic hydrocarbons such as benzene, toluene, xylene, ethylbenzene, aromatic petroleum naphtha, tetralin, turpentine oil, and Solvesso #100 or #150 (trademarks of EXXON CHEMICAL CO.); ethers such as dioxane and tetrahydrofuran; esters and etheresters such as methyl acetate, ethyl acetate, n-propyl acetate, isopropyl acetate, n-butyl acetate, isobutyl acetate, s-butyl acetate, amyl acetate, propyleneglycol monomethyl ether, triethyleneglycol dimethyl ether, tetraethyleneglycol dimethyl ether, diethyleneglycol monobutyl ether acetate, and methoxybutyl acetate; ketones such as acetone, methyl ethyl ketone, methyl isobutyl ketone, methyl amyl ketone, cyclohexanone, isophorone, methyloxide, methyl isoamyl ketone, ethyl butyl ketone, ethyl amyl ketone, diisobutyl ketone, diethyl ketone, methyl propyl ketone, and diisopropyl ketone; phosphates such as trimethyl phosphate, triethyl phosphate, and tributyl phosphate; dimethylsulfoxide, and N,N-dimethylformamide. As the organic solvent, one or a combination of two or more of the above may be used.

In the present flux composition, the content of compound (X) is usually 5 to 95 wt %, preferably 10 to 90 wt % of the total weight of the composition. With the content of less than 5 wt %, sufficient wettability is not given to the solder, whereas with the content of more than 95 wt %, residues remain uncleaned to impair the reliability, thus being not preferred.

Compound (Y) may be a compound represented by the formula (3), wherein all the carboxyl groups are shown blocked, but some may be left unblocked, as long as the objects of the present invention are achieved. Further, one of the hydroxyl group and the vinyl group of the hydroxy vinyl ether may have been reacted, while the other may be left unreacted.

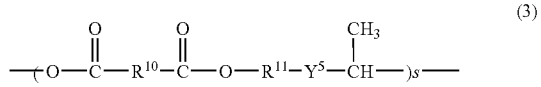

In the formula (3), $R^{10}$ stands for a substituted or unsubstituted divalent aliphatic or aromatic group having 1 to 50 carbon atoms, $R^{11}$ stands for a divalent hydrocarbon group or glycol residue having 1 to 50 carbon atoms, $Y^5$ stands for an oxygen or sulfur atom, and s is an integer of 1 to 500.

Compound (Y) may be prepared by reacting an acid anhydride, which is an anhydride of carboxylic acid having two or more carboxyl groups in a molecule, and a hydroxy vinyl ether compound, which is a hydroxy vinyl ether having one vinyl ether group and one hydroxyl group in a molecule, or a hydroxy vinyl thioether having one vinyl thioether group and one hydroxyl group in a molecule.

The acid anhydride may be a compound represented by the formula (3-1), and the hydroxy vinyl ether compound may be a hydroxy vinyl ether or thioether represented by the formula (3-2):

wherein $R^{10}$, $R^{11}$, and $Y^5$ are the same as those in the formula (3) above.

Examples of the acid anhydride represented by the formula (3-1) may include succinic, maleic, itaconic, citraconic, tetrahydrophthalic, hexahydrophthalic, 4-methyltetrahydrophthalic, 4-methylhexahydrophthalic, 3-methyltetrahydrophthalic, dodecenylsuccinic, phthalic, diglycolic, and glutaric anhydrides.

Examples of the hydroxyvinyl ether represented by the formula (3-2) may include hydroxymethyl, hydroxyethyl, hydroxypropyl, hydroxybutyl, hydroxypentyl, hydroxyhexyl, hydroxyheptyl, hydroxyoctyl, hydroxynonyl, 4-hydroxycyclohexyl, 3-hydroxycyclohexyl, and 2-hydroxycyclohexyl vinyl ethers, and cyclohexanedimethanol, diethyleneglycol, triethyleneglycol, and tetraethyleneglycol monovinyl ethers. Examples of the hydroxy vinyl thioether represented by the formula (3-2) may include compounds corresponding to the above examples of the hydroxy vinyl ether.

Compound (Y) may typically be derived from a succinic anhydride and a hydroxy vinyl ether.

For producing a flux cleanable with an organic solvent, compound (Y) in the present flux composition may be prepared from any of the acid anhydrides and any of the hydroxy vinyl ethers as the starting materials. For producing a water-cleanable flux, compound (Y) in the flux composition may preferably be a reaction product of at least one acid anhydride selected from the group consisting of succinic, maleic, diglycolic, itaconic, citraconic, and glutalic anhydrides, and at least one hydroxy vinyl ether compound selected from the group consisting of hydroxyethyl vinyl ether, hydroxypropyl vinyl ether, diethyleneglycol monovinyl ether, and triethyleneglycol monovinyl ether. Here, "water-cleanable" as used herein means that compound (A), when added to a flux or a solder paste, is decomposed and removed by cleaning with water, and that compound (A) per se is not necessarily water soluble. Further, "water-cleanable" is not limited to cleaning with water, and semi-aqueous cleaners may also be used, such as water-alcohol, water-limonene, and water-glycol ether cleaners.

For producing a no-clean flux, compound (Y) may preferably be a reaction product of at least one acid anhydride selected from the group consisting of tetrahydrophthalic, hexahydrophthalic, 4-methyltetrahydrophthalic, and 4-methylhexahydrophthalic anhydrides, and at least one hydroxy vinyl ether compound selected from the group consisting of hydroxyethyl vinyl ether, hydroxypropyl vinyl ether, hydroxybutyl vinyl ether, hydroxypentyl vinyl ether, hydroxyethyl vinyl thioether, hydroxypropyl vinyl thioether, and hydroxybutyl vinyl thioether. Further, for producing a no-clean flux from the present flux composition containing a compound having one reactive functional group in a molecule capable of forming a chemical bond with a carboxyl group upon heating, as will be discussed later, compound (Y) in the flux composition may be prepared from any of the acid anhydrides and any of the hydroxy vinyl ethers as the starting materials.

The ratio of the acid anhydride to the hydroxy vinyl ether compound for the reaction may be 1:0.5 to 5 in equivalence ratio. The temperature for the reaction is usually in the range from the room temperature to 200° C., preferably in the range from the room temperature to 150° C. The duration of the reaction may suitably be selected depending on the progress of the reaction, and may usually be 1 to 100 hours. The end point of the reaction may preferably be, for example, when the acid number of the reaction system is determined to be not larger than 20 mgKOH/g. Accordingly, the acid number of the reaction product is preferably not larger than 20 mgKOH/g. It is particularly preferred to perform the reaction so that all of the carboxyl groups in composition (Y) are blocked, but some of the carboxyl groups, such as those at the terminals, may be left unblocked, as long as the objects of the present invention are achieved. Further, an acid catalyst, such as an acidic phosphate represented by the formula (8) above, may be used for promoting the reaction.

The amount of the acid catalyst is not particularly limited, and is usually 0.01 to 5 parts by weight, preferably 0.1 to 1 parts by weight based on 100 parts by weight of the acid anhydride and the hydroxy vinyl ether compound together.

The organic solvent may also be used here that was referred to above as usable in the production of compound (X) for homogenizing the reaction system to facilitate the reaction. The amount of the organic solvent is not particularly limited, and is usually 5 to 95 parts by weight, preferably 10 to 90 parts by weight, more preferably 20 to 80 parts by weight based on 100 parts by weight of the acid anhydride and the hydroxy vinyl ether together.

Compound (Y) may have a weight average molecular weight (Mw) of usually 300 to 100000, preferably 500 to 50000. With Mw of lower than 300, printability of the resulting solder paste prepared with the compound is inferior, whereas with Mw of higher than 100000, many solder balls are disadvantageously formed.

In the present flux composition, the content of compound (Y), if any, is not particularly limited, and is usually 5 to 95 wt %, preferably 10 to 90 wt % of the total weight of the composition.

Compound (Z) may be a compound represented by the formula (4) having in a molecule at least one hemiacetal group formed by addition of carboxylic acid to an unsaturated vinyl group, and ester groups of carboxylic acid and a hydroxyl group. In the formula (4), all the carboxyl groups are shown blocked, but some may be left unblocked, as long as the objects of the present invention are achieved. Further, at the reactive terminal groups, one of the vinyl groups of the divinyl ether may have been reacted, and the other may remain as a double bond.

diethylene, and propylene glycols being particularly preferred for their availability and reactivity.

The divinyl ether compound for preparing compound (Z) may be a compound represented by the formula (4-2):

$$CH_2=CH-Y^6-R^{14}-Y^6-CH=CH_2 \quad (4\text{-}2)$$

wherein $Y^6$ and $R^{14}$ are the same as those in the formula (4)

Examples of the divinyl ether compound may include diethylene glycol divinyl ether, triethylene glycol divinyl ether, 1,4-bisvinyloxymethylcyclohexene, ethylene glycol divinyl ether, polyethylene glycol divinyl ether, butanediol divinylether, 1,4-cyclohexanedimethanoldivinylether, and corresponding divinyl thioethers, with diethylene glycol divinyl ether and butanediol divinyl ether being particularly preferred for their boiling point and reactivity.

Compound (Z) may preferably be prepared from a combination of the starting materials such as a succinic, maleic, or itaconic anhydride, or a mixture thereof as the acid anhydride; ethylene, diethylene, or propylene glycol, or a mixture thereof as the polyhydric alcohol; and diethylene glycol or butanediol divinyl ether, or a mixture thereof as the divinyl ether.

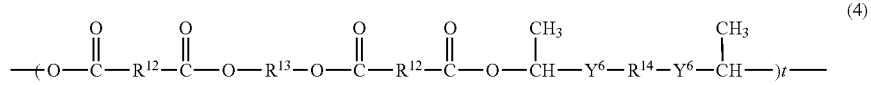

In the formula (4), $R^{12}$, $R^{13}$, and $R^{14}$ each independently stands for a divalent organic residue, Y stands for an oxygen or sulfur atom, and t is an integer of 1 to 500.

Compound (Z) is prepared by addition polymerization of a reaction product of an acid anhydride and a polyhydric alcohol (sometimes referred to as a modified carboxylic acid compound hereinbelow) with a divinyl ether compound, and may preferably be used for rendering a flux composition water-cleanable. Compound (Z) may have a Mw of usually 500 to 500000, preferably 1000 to 50000. With the Mw of lower than 500, printability of the resulting solder paste prepared with the compound is inferior, whereas with the Mw of higher than 500000, many solder balls are disadvantageously formed.

The acid anhydride for preparing compound (Z) may be the acid anhydride represented by the formula (3-1) above, and the specific examples referred to above may also be preferred here. Among the examples, succinic, maleic, and itaconic anhydrides are preferred, with succinic anhydride being particularly preferred for its cleanability with water, workability, and reactivity with polyhydric alcohols, as well as for the solubility of the resulting compound in a solvent and its compatibility with other resins.

The polyhydric alcohol for preparing compound (Z) may be a compound represented by the formula (4-1):

$$HO-R^{13}-OH \quad (4\text{-}1)$$

wherein $R^{13}$ is the same as that in the formula (4) above.

Examples of the polyhydric alcohol may include ethylene glycol, diethylene glycol, triethylene glycol, tetraethylene glycol, 1,2-propylene glycol, 1,3-propylene glycol, 1,3-butanediol, 1,4-butanediol, 2,3-butanediol, 1,6-hexanediol, pentanediol, dimethylbutanediol, trimethylolpropane, trimethylolethane, glycerine, and pentaerythritol, with ethylene, For producing a flux cleanable with an organic solvent, compound (Z) in the present flux composition may be prepared from any of the starting materials without specific limitation. For producing a water-cleanable flux, compound (Z) in the flux composition may preferably be prepared from at least one member selected from the group consisting of succinic, maleic, diglycolic, itaconic, citraconic, and glutalic anhydrides as the acid anhydride, and at least one member selected from the group consisting of ethyleneglycol, diethylene glycol, triethylene glycol, tetraethylene glycol, 1,2-propyleneglycol, 1,3-propyleneglycol, 1,3-butanediol, 1,4-butanediol, 2,3-butanediol, trimethylolpropane, glycerine, and pentaerythritol as the polyhydric alcohol. For producing a no-clean flux, compound (Z) in the flux composition may be prepared from any reaction product with a boiling point of not higher than 300° C. of the acid anhydride and the polyhydric alcohol, and any divinyl ether compound, which is to be volatized and thus imposes no limitation. Further, for producing a no-clean flux from the present flux composition containing a compound having one reactive functional group in a molecule capable of forming a chemical bond with a carboxyl group upon heating, as will be discussed later, compound (Z) in the flux composition may be prepared from any of the starting materials without particular limitation.

The modified carboxylic acid compound for preparing compound (Z) may be prepared, for example, by reacting the acid anhydride and the polyhydric alcohol without or in a suitable solvent at a temperature from the room temperature to 200° C. The end point of the reaction may preferably be when not less than 98% of the reaction has been determined to be completed by measuring half and total acid numbers of the resulting resin.

The ratio of the modified carboxylic acid compound to the divinyl ether compound for the reaction may be usually 1.0: 0.5 to 5.0, preferably 1.0:1.0 to 4.0, more preferably 1.0:1.0 to 3.0 in equivalence ratio.

For preparing compound (Z), the modified carboxylic acid compound and the divinyl ether compound may be reacted, for example, at a reaction temperature of 30 to 200° C., preferably 50 to 150° C., for a duration of 10 minutes to 6 hours, preferably 20 minutes to 5 hours. The end point of the reaction may preferably be, for example, when the acid number of the reaction system is determined to be not larger than 10 mgKOH/g, preferably not larger than 5 mgKOH/g. It is preferred to perform the reaction so that all of the carboxyl groups in compound (Z) are blocked, but some of the carboxyl groups, such as those at the terminals, may be left unblocked, as long as the objects of the present invention are achieved.

In the reaction, an acid catalyst may be used for promoting the reaction, and an organic solvent may also be used for homogenizing the reaction system to facilitate the reaction. Such acid catalyst and organic solvent may be those exemplified in the discussion of compound (X) above. The solvent may be removed before the composition is used for a flux. However, in view of the productivity, it is preferred to use no solvent, to use a water-cleanable solvent for the reaction, or to use a solvent decomposable or volatile under the conditions in which fluxes or solder pastes are used. Examples of such solvent may include propylene glycol monomethyl ether acetate and methyl ethyl ketone.

The amount of the acid catalyst is not particularly limited, and is usually 0.01 to 5.0 parts by weight, preferably 0.1 to 1.0 parts by weight, based on 100 parts by weight of the modified carboxylic acid compound and the divinyl ether compound together. The amount of the organic solvent is not particularly limited, and is 5 to 95 parts by weight, preferably 20 to 80 parts by weight, based on 100 parts by weight of the modified carboxylic acid compound and the divinyl ether compound together.

The content of compound (Z), if any, in the flux composition is not particularly limited, and is usually 10 to 100 wt %, preferably 50 to 90 wt %. At less than 10 wt %, the intended effect is not obtained. A urethane or polyester component, for example, may be bound to compound (Z).

In the flux composition according to the present invention, compounds (X) to (Z) as compound (A) may be combined and mixed for use. The combination and the mixing ratio may suitably be decided depending on the application. For example, when the combination of compounds (Y) and (X) is used, the content of compound (X) may be 0.1 to 30 wt %, preferably 1 to 20 wt % of the total amount of the composition.

In compound (A) used in the present flux composition, the blocked carboxyl groups are unblocked upon heating, or irradiation with active energy beams such as UV or electron beams, to expose reactive carboxyl groups. In the case of compound (Z), for example, the hemiacetal ester structure in the principal chain is decomposed, and a corresponding low molecular weight compound is generated.

The decomposition is promoted by a latent heat catalyst or photocatalyst, so that such catalysts may preferably be contained in the present flux composition.

Examples of the latent heat catalyst may include protonic acids, such as halogenocarboxylic acids, sulfonic acids, sulfuric acid monoesters, phosphoric acid mono- and diesters, polyphosphoric acid esters, and boric acid mono- and diesters; compounds obtained by neutralizing a Lewis acid, such as $BF_3$, $FeCl_3$, $SnCl_4$, $AlCl_3$, and $ZnCl_3$, with a Lewis base; onium compounds; and mixtures thereof. Particularly preferred are protonic acids, mixtures of a Lewis acid and a trialkylphosphate, sulfonic acid esters, phosphoric acid esters, onium compounds, and mixtures thereof.

More specific examples may include pyridine salts of p-toluenesulfonic acid, pyridine salts of dodecylbenzene sulfonic acid, pyridine salts of naphthalene sulfonic acid, and pyridine salts of naphthalene disulfonic acid; metal halides, such as boron trifluoride, aluminum trichloride, titanium (II) chloride, titanium (III) oxide, ferrous chloride, ferric chloride, zinc chloride, zinc bromide, stannous chloride, stannic chloride, stannous bromide, and stannic bromide; organometallic compounds, such as trialkyl boron, trialkyl aluminum, dialkyl aluminum halide, monoalkyl aluminum halide, and tetraalkyltin; metal chelate compounds, such as diisopropoxy ethylacetoacetate aluminum, tris(ethylacetoacetate)aluminum, isopropoxy bis(ethylacetoacetate)aluminum, monoacetyl acetonato bis(ethylacetoacetate)aluminum, tris (n-propylacetoacetate)aluminum, tris(n-butylacetoacetate) aluminum, monoethylacetoacetate bis(acetylacetonato)aluminum, tris(acetylacetonato)aluminum, tris (propyonylacetonato)aluminum, acetylacetonato bis (propyonylacetonato)aluminum, diisopropoxy bis (ethylacetoacetate) titanium, diisopropoxy bis (acetylacetonato)titanium, tetrakis(n-propylacetoacetate) zirconium, tetrakis(acetylacetonato)zirconium, tetrakis (ethylacetoacetate) zirconium, dichloro bis(acetylacetonato) tin, dibutylbis(acetylacetonato)tin, tris(acetylacetonato) iron, tris(acetylacetonato) chromium, tris(acetylacetonato) rhodium, bis(acetylacetonato)zinc, and tris(acetylacetonato) cobalt; and metal soaps, such as dibutyltin dilaurate, dioctyltin ester maleate, magnesium naphthate, calcium naphthate, manganese naphthate, iron naphthate, cobalt naphthate, copper naphthate, zinc naphthate, zirconium naphthate, lead naphthate, calcium octylate, manganese octylate, iron octylate, cobalt octylate, zinc octylate, zirconium octylate, tin octylate, lead octylate, zinc laurate, magnesium stearate, aluminum stearate, calcium stearate, cobalt stearate, zinc stearate, and lead stearate.

Examples of the photocatalyst may include β-ketosulfone, iminosulfonate, benzoinsulfonate, O-nitrobenzylsulfonate, and ADEKA OPTOMER SP Series (trade name, manufactured by ASAHI DENKA CO., LTD.).

One or a mixture of two or more of the latent heat catalysts or the photocatalysts may be used, and the amount thereof is usually 0.01 to 10 parts by weight, based on 100 parts by weight of compound (A). With the amount of less than 0.01 parts by weight, sufficient catalytic effect cannot be obtained, whereas with the amount of more than 10 parts by weight, the low molecular weight compounds resulting from the decomposition are undesirably colored, or side reaction may occur.

The flux composition according to the present invention may optionally contain, in addition to compound (A), at least one member selected from the group consisting of activators, solvents, thixotropic agents, antioxidants, rust preventive agents, and chelating agents, depending on the required performance.

Examples of the activators may include amine salts of hydrochloric and hydrobromic acids, carboxylic acid, and amine salts thereof. More specific examples may include hydrochloride or hydrobromide of methyl, dimethyl, trimethyl, ethyl, diethyl, triethyl, n-propyl, di-n-propyl, tri-n-propyl, isopropyl, diisopropyl, triisopropyl, butyl, dibutyl, monoethanol, diethanol, and triethanol amines; oxalic, malonic, succinic, adipic, glutaric, 2,4-diethylglutaric, 2,4-dimethylglutaric, pimelic, azelaic, sebacic, maleic, fumaric, lactic, diglycolic, capric, lauric, myristic, palmitic, linoleic, oleic, benzoic, hydroxypivalic, dimethylolpropionic, citric, malic, glyceric, stearic, arachic, behenic, and linolenic acids, and amine salts thereof.

The content of the activator, if any, is preferably 1 to 30 wt %, more preferably 1 to 20 wt % of the total weight of the composition.

The solvent may suitably be selected from ordinary solvents of general-purpose. Examples of the solvent may include aromatic hydrocarbons such as toluene and xylene; alcohols such as methanol, ethanol, and isopropanol; esters such as ethyl acetate, ethyl lactate, and butyl acetate; ethers such as 1,4-dioxaneandtetrahydrofuran; ketones such as methyl ethyl ketone, methyl isobutyl ketone, and cyclohexanone; glycol derivatives such as cellosolve and butyl cellosolve; glycols such as ethylene glycol, diethylene glycol, dipropylene glycol, triethylene glycol, hexylene glycol, and 1,5-pentanediol; glycol ethers such as methyl carbitol and butyl carbitol; and petroleum solvents such as petroleum ether and naphtha, with methyl ethyl ketone and 2-propanol being preferred.

The content of the solvent, if any, is preferably 5 to 95 wt % of the total weight of the composition.

The thixotropic agent may be of any kind. Examples of the thixotropic agent may include fatty acid amides such as castor wax, beeswax, carnauba wax, stearamide, and hydroxystearic acid bisamide; organic thixotropic agents such as low molecular weight polyethylene glycol, high molecular weight polyethylene oxide, methyl cellulose, ethyl cellulose, hydroxyethyl cellulose, hydroxypropyl cellulose, diglycerine monooleate, decaglycerine laurate, decaglycerine oleate, diglycerine monolaurate, and sorbitan laurate; and inorganic thixotropic agents such as silica powders and kaolin powders, with polyethylene glycol, castor wax, and fatty acid amides being preferred.

The content of the thixotropic agent, if any, is preferably 1 to 30 wt % of the total weight of the composition.

The content of the antioxidant and/or the rust preventive agent, if any, is preferably 0.01 to 30 wt % of the total weight of the composition.

Further, the flux composition according to the present invention may optionally contain matting agents, coloring agents, defoaming agents, dispersion stabilizers, and/or chelating agents.

An example of the flux composition according to the present invention may contain 5 to 95 wt % compound (A), 1 to 30 wt % activator, 1 to 30 wt % thixotropic agent, 0.01 to 30 wt % antioxidant and/or rust preventive agent, and 8 to 95 wt % solvent.

For producing a no-clean flux or a no-clean solder paste, the flux composition according to the present invention may optionally contain a compound having one reactive functional group in a molecule capable of forming a chemical bond with a carboxyl group upon heating (referred to as monofunctional compound (I) hereinbelow). Such a monofunctional compound, when contained in the composition, blocks the carboxyl groups in the compound (A) and/or the activator left over after the process, to prevent adverse effects of the residual carboxyl groups. Thus the composition with the monofunctional compound may be used for a no-clean products.

Examples of the functional group in the monofunctional compound may include an epoxy group, an oxazoline residue, a silanol residue, an alkoxysilane group, a hydroxyl group, an amino group, an imino group, an isocyanate group, a cyclocarbonate group, a vinyl ether group, a vinyl thioether group, an aminomethylol group, an alkylated aminomethylol group, an acetal residue, and a ketal residue, with an epoxy group, an oxazoline residue, and a vinyl ether group being preferred.

Examples of the monofunctional compound having an epoxy group may include glycidyl ethers of aliphatic alcohols having 1 to 20 carbon atoms such as methyl, butyl, 2-ethylhexyl, decyl, and stearyl glycidyl ethers; aromatic glycidyl ethers such as phenyl and t-butylphenyl glycidyl ethers; and glycidyl esters of fatty acids having 2 to 20 carbon atoms such as glycidyl laurate, glycidyl stearate, and glycidyl oleate. Specifically preferred are glycidyl ethers of aliphatic alcohols having 12 to 20 carbon atoms, aromatic glycidyl ethers having 6 to 10 carbon atoms, and glycidyl esters of fatty acids having 12 to 20 carbon atoms, for preventing generation of odor during working or the like.

Examples of the monofunctional compound having an oxazoline residue may include 2-methyl-2-oxazoline, 4,4-dimethyl-2-oxazoline, 5-methyl-2-oxazoline, 4,5-dimethyl-2-oxazoline, and 4,4,5,5-tetramethyl-2-oxazoline. Examples of the monofunctional compound having a vinyl ether group may include alkylvinyl ethers.

The content of the monofunctional compound, if any, is preferably 0.1 to 50 parts by weight based on 100 parts by weight of compound (A) and the activator together.

The flux composition according to the present invention may be prepared by any method. For example, the flux composition may be prepared by blending all the materials together, or by taking the solvent in a container, and mixing and dissolving other materials therein one after another. For mixing, for example, a vacuum mixer, a kneader, a homodisper, or a three-one motor may be used. The mixing may be performed at any temperature and under any conditions, but preferably performed at 10 to 30° C. in a clean room.

The solder paste according to the present invention contains the flux composition and solder powder.

The solder powder may be of any kind, and for example, of conventional Sn/Pb, Sn/Ag, Sn/Ag/Cu, Sn/Cu, Sn/Zn, Sn/Zn/Bi, Sn/Zn/Bi/In, Sn/Bi, or Sn/In alloy. The solder particle may either be of spherical or amorphous shape, and may be of any ordinary diameter. In the case of spherical particles, the diameter is preferably 20 to 60 μm.

The solder powder may have any alloy composition. Preferred examples may include Sn63/Pb37, Sn/Ag3.5, Sn/Ag3.5/Cu0.5, Sn/Ag2.9/Cu0.5, Sn/Ag3.0/Cu0.5, Sn/Bi58, Sn/Cu0.7, Sn/Zn9, and Sn/Zn8/Bi3, wherein the values indicate the weight ratio of the metals. For avoiding problems associated with solder disposal, such as air pollution by lead, lead-free solders are preferred. The content of the flux in the solder paste is usually 1 to 50 wt %, specifically 5 to 30 wt %, more specifically 5 to 15 wt % of the total weight of the solder paste. With less than 50 wt % or more than 99 wt % solder powder, required solder printability is not obtained, thus not being preferred. In view of recent environmental problems and recycling, lead-free solder pastes are preferred.

The solder paste according to the present invention may be prepared by kneading and mixing the solder powder with the flux composition by an ordinary method. For mixing, for example, a vacuum mixer, a kneader, or a planetary mixer may be used. The mixing may be performed at any temperature and under any conditions, but preferably performed at 5 to 25° C. in a nitrogen atmosphere. The mixing ratio of the flux composition to the solder powder is not particularly limited, and is usually 5 to 20:80 to 95 by weight.

The solvent used as needed for preparing the solder paste may preferably be those having a boiling point of not lower than 150° C. Examples of the solvent may include triethylene glycol monomethyl ether, triethylene glycol dimethyl ether, tetraethylene glycol dimethyl ether, diethylene glycol monomethyl ether, diethylene glycol monobutyl ether, diethylene glycol monohexyl ether, ethylene glycol monophenyl ether, diethylene glycol monophenyl ether, diethylene glycol monobutyl acetate, dipropylene glycol, diethylene glycol-2-ethylhexyl ether, α-terpineol, benzyl alcohol, 2-hexyldecanol, butyl benzoate, diethyl adipate, diethyl phthalate, dodecane, tetradecene, dodecylbenzene, ethylene glycol, diethylene glycol, dipropylene glycol, triethylene glycol, hexylene glycol, 1,5-pentanediol, methyl carbitol, and butyl carbitol, with triethylene glycol dimethyl ether, tetraethylene glycol dimethyl ether, and diethylene glycol monobutyl acetate being preferred.

The solder paste according to the present invention may optionally contain an antioxidant, a matting agent, a coloring agent, a defoaming agent, a dispersion stabilizer, and/or a chelating agent.

The solder paste according to the present invention may be used as a solder for a reflow solder process in the production of electronic components, electronic modules, and printed wiring boards, by printing the solder paste through a metal mask using a solder printer in accordance with an ordinary method. Specifically, the following soldering method according to the present invention is preferred.

The methods of soldering according to the present invention are a method including the steps of (A) providing the flux composition on an electrode portion of a substrate, (B) providing a solder bumped electronic component, (C) placing the electronic component provided in step (B) on the substrate obtained in step (A), and (D1) subjecting the substrate with the electronic component obtained in step (C) to reflow for mounting; a method including step (A), and step (D2) of supplying solder onto the substrate with the flux composition obtained in step (A), by flowing or dipping; and a method including the steps of (X) printing the solder paste of the present invention on an electrode portion of a substrate, (Y) placing an electronic component on the substrate obtained in step (X), and (Z) subjecting the substrate with the electronic component to reflow for mounting.

In the methods of soldering according to the present invention, each step may be performed by an ordinary method under ordinary conditions, as long as the flux composition or the solder paste according to the present invention is used as the flux or the solder paste.

In the methods of soldering according to the present invention, a cleaning step with water may be performed in addition to the above steps, when the water-cleanable flux composition or solder paste of the present invention is used in the method, whereas no such cleaning step is required when the no-clean flux composition or solder paste of the present invention is used.

Since the flux composition according to the present invention contains compound (A), which gives a carboxylic acid compound of a low molecular weight when thermally decomposed, the composition has a high flux activity, gives excellent reliability to resulting joints, and may be prepared with a reduced amount of solvent. Further, in the solder paste according to the present invention, the base resin or the activator is excellently inhibited from being reacted with the solder powder in the solder paste, which is reduced in average particle size to keep up with the downsizing of electronic products or fine pitch requirements. Thus the solder paste of the present invention has excellent storage stability, as well as wettability. Specifically, wettability and storage stability of a conventional lead-free, Sn/Zn solder paste may be improved, which paste has hardly been used practically due to its extremely poor wettability and storage stability. Further, since the composition of the present invention is non-curing, and thus little or no flux residue occurs, the present composition is extremely useful for preparing, for example, fluxes for soldering IC chips directly to a silicon wafer, flowing fluxes, and dipping fluxes, in which applications thermosetting fluxes cannot be used.

EXAMPLES

The present invention will now be explained in detail with reference to examples, but the present invention is not limited thereto.

In the following examples, the acid number was determined by dissolving a predetermined amount of resin in a THF solution, and titrating with a KOH/ethanol solution, using phenolphthalein as an indicator, in accordance with JIS K 0070-3 (1992). The viscosity was measured with an EHD viscometer manufactured by TOKI SANGYO CO., LTD, at the revolution of 0.5 to 100 rpm at 25° C. for 3 minutes. The decomposition point was measured with "TG/DTA220" manufactured by SEIKO INSTRUMENTS INC., at the heating rate of 10° C./min, at the nitrogen flow rate of 50 ml/min. The weight average molecular weight (Mw) was measured using a gel permeation chromatography system, SC-8010 (GPC) manufactured by TOSOH CORPORATION, "SHODEX K-801" manufactured by SHOWA DENKO K.K. as a column, THF as an eluent, and a RI detector, and determined in terms of polystyrene standards.

Further in the examples, "natural rosin" refers to "CHUGOKU ROSIN X" (trade name) manufactured by HARIMA CHEMICALS, INC., "hydrogenated rosin" refers to "PINE CRYSTAL KE-604" (trade name) manufactured by ARAKAWA CHEMICAL INDUSTRIES, LTD., 2-EHVE refers to 2-ethylhexyl vinyl ether, n-PVE refers to n-propyl vinyl ether, n-BuVE refers to n-butyl vinyl ether, TEGDVE refers to triethylene glycol divinyl ether, 1,4-BDDVE refers to 1,4-butanediol divinyl ether, PMA refers to propylene glycol monomethyl ether acetate, "RIKACID MH-700" (trade name) refers to a mixture of hexahydrophthalic anhydride and methylhexahydrophthalic anhydride manufactured by NEW JAPAN CHEMICAL CO., LTD., HEVE refers to hydroxyethyl vinyl ether, HBVE refers to hydroxybutyl vinyl ether, DEGMVE refers to diethylene glycol monovinyl ether, the acid catalyst is a zinc complex prepared by reacting zinc octylate and triethanol amine at an equal molar ratio, "EPIOL SK" (trade name) refers to stearyl glycidyl ether manufactured by NOF CORPORATION, DEGHE refers to diethylene glycol hexyl ether, BCA refers to butyl carbitol acetate, PEG refers to polyethylene glycol, and TEG refers to triethylene glycol.

Synthesis Example 1

321 g of natural rosin and 209 g of 2-EHVE were placed in a four-neck flask of 1 liter capacity equipped with a thermometer, a reflux condenser, and a stirrer. The mixture was heated from an ordinary temperature to 120° C. over 30 minutes, and reacted at 120° C. for 2.5 hours. When the acid number was confirmed to be not higher than 5 mgKOH/g, the reaction was terminated. Then unreacted 2-EHVE was distilled off with a rotary evaporator, to obtain a clear brown rosin derivative (R-1) having a viscosity of 6.8 poise. The composition and the reaction conditions, as well as the obtained amount, yield, acid number, viscosity, and decomposition point of the rosin derivative (R-1) are shown in Table 1.

Synthesis Examples 2 to 4

Rosin derivative (R-2) and vinyl ether-blocked adipic acid (A-1) and (A-2) were prepared in the same way as in Synthesis Example 1, except that the composition and the reaction conditions were changed as shown in Table 1. The properties of (R-2), (A-1), and (A-2) are shown in Table 1.

TABLE 1

| | | Syn. 1 | Syn. 2 | Syn. 3 | Syn. 4 |
|---|---|---|---|---|---|
| Product (code) | | (R-1) | (R-2) | (A-1) | (A-2) |
| Composition in parts by weight | Natural rosin | 321 | — | — | — |
| | Hydrogenated rosin | — | 502 | — | — |
| | Adipic acid | — | — | 260 | — |
| | 2,4-diethylglutaric acid | — | — | — | 309 |
| | 2-EHVE | 209 | — | — | — |
| | n-PrVE | — | — | 267 | — |
| | n-BuVE | — | — | — | 491 |
| | TEGDVE | — | 298 | — | — |
| Reaction conditions | Temperature (° C.) | 120 | 100 | 100 | 100 |
| | Duration (hrs) | 2.5 | 2.0 | 2.5 | 4.0 |
| Amount obtained (g) | | 325 | 504 | 312 | 400 |
| Yield (%) | | 61 | 63 | 59 | 50 |
| Acid number (mgKOH/g) | | 4.5 | 3.9 | 2.1 | 2.5 |
| Viscosity (pois) | | 6.8 | 1.5 | 0.1 | 0.8 |
| Decomposition point (° C.) | | 193 | 236 | 165 | 188 |

Synthesis Examples 5 and 6

Monomers having a composition shown in Table 2 were placed in a four-neck flask equipped with a thermometer, a reflux condenser, and a stirrer. The mixture was stirred into homogeneity at 60° C., heated to 140° C., and kept reacting at this temperature. When not less than 98% of the reaction had been completed, which was confirmed by measuring the half acid number and the total acid number of the resin, the reaction was terminated. Then, the solvent was removed from the reaction product under reduced pressure, to obtain a half ester compound of diol and an acid anhydride, i.e., a derivative of dicarboxylic acid half ester (H-1) and (H-2)

TABLE 2

| | | Syn. 5 | Syn. 6 |
|---|---|---|---|
| Product (code) | | (H-1) | (H-2) |
| Composition in parts by weight | Succinic anhydride | 58.3 | 48.9 |
| | Ethylene glycol | 21.7 | — |
| | Diethylene glycol | — | 31.1 |
| | Methyl ethyl ketone | 20.0 | 20.0 |

Synthetic Examples 7 to 10

Monomers having a composition shown in Table 3 were placed in a four-neck flask equipped with a thermometer, a reflux condenser, and a stirrer. The mixture was heated from an ordinary temperature to 120° C. over 30 minutes, and kept reacting at 120° C. When the acid number after mixing became not more than 10 mgKOH/g, or the infrared absorption spectrum at 3543 cm$^{-1}$ corresponding to the hydroxyl group in the carboxyl group disappeared, the reaction was terminated. After the termination of the reaction, unreacted divinyl ether and the solvent were distilled off with a rotary evaporator, to obtain a polyhemiacetal ester resin (P-1) to (P-4). The properties of these resins are shown in Table 3.

TABLE 3

| | | Syn. 7 | Syn. 8 | Syn. 9 | Syn. 10 |
|---|---|---|---|---|---|
| Product code | | (P-1) | (P-2) | (P-3) | (P-4) |
| Starting Material Composition in parts by weight | Adipic acid | 32.5 | — | — | — |
| | 2,4-diethylglutaric acid | — | 30.6 | — | — |
| | (H-1) | — | — | 51.0 | — |
| | (H-2) | — | — | — | 50.7 |
| | TEGDVE | — | 39.4 | — | — |
| | 1,4-BDDVE | 67.5 | — | 29.0 | 29.3 |
| | PMA | — | 30.0 | 20.0 | 20.0 |
| Yield (%) | | 63.0 | 61.9 | 62.8 | 61.5 |
| Acid number (mgKOH/g) | | 9.3 | 8.5 | 3.2 | 4.3 |
| Viscosity (Pa · s) | | 3.4 | 5.5 | 6.0 | 4.8 |
| Decomposition point (° C.) | | 224.0 | 243.7 | 239.3 | 239.9 |
| Weight average molecular weight (Mw) | | 13000 | 60200 | 9700 | 11400 |

Synthesis Examples 11 to 14

Monomers having a composition shown in Table 4 were placed in a four-neck flask equipped with a thermometer, a reflux condenser, and a stirrer. The mixture was heated from an ordinary temperature to 110-120° C. over 30 minutes, and reacted at 110 to 120° C. for 4 hours. When the acid number after mixing was confirmed to be not more than 20 mgKOH/g, the reaction was terminated. Then the polymer component was purified by reprecipitation with a hexane/acetone (9/1 in volume ratio) mixed solvent. After the solvent was distilled off of the mixed solution with a rotary evaporator, the reaction product was vacuum dried with a vacuum pump, to obtain a clear, light yellow resin having the properties shown in Table 4.

TABLE 4

| | | Syn. 11 | Syn. 12 | Syn. 13 | Syn. 14 |
|---|---|---|---|---|---|
| Product code | | (S-1) | (S-2) | (S-3) | (S-4) |
| Composition in parts by weight | Succinic anhydride | 24.3 | 22.2 | 19.2 | — |
| | RIKACID MH-700 | — | — | — | 34.2 |
| | HEVE | 63.7 | — | — | 35.8 |
| | HBVE | — | 51.6 | — | — |
| | DEGMVE | — | — | 50.8 | — |
| | PMA | 12.0 | 26.2 | 30.0 | 30.0 |
| Yield (%) | | 59.7 | 56.8 | 55.6 | 45.9 |
| Acid number (mgKOH/g) | | 15.3 | 12.1 | 17.5 | 15.3 |
| Viscosity (pois) | | 358 | 337 | 306 | 5200 |
| Decomposition point (° C.) | | 203 | 202 | 216.1 | 227.1 |
| Weight average molecular weight (Mw) | | 4900 | 8900 | 5400 | 6300 |

Examples 1-1 to 1-9

A flux having a composition shown in Table 5 was prepared, using each blocked carboxylic acid compound prepared in Synthesis Examples. The obtained flux was evaluated by the following testing and evaluating methods. The results are shown in Table 5

<Evaluation of Solder Ball Spread>

Solder ball spread was measured in accordance with the measuring method shown in FIG. 1. That is, solder ball 10a having a diameter of 0.76 mm and flux 10b to be measured were placed on thick film Cu conductor 11 (FIG. 1(a)), and reflowed at the peak temperature in the atmosphere (FIG.

1(b)). The diameter of the resulting, spread solder ball was determined in percentage to the average value Z. Here, the solder ball does not always spread evenly as shown in FIG. 1(c), so that the average value of spread Z (Z=(X+Y)/2) was calculated, and the spread was determined as ((Z−0.76)/0.76)×100 (%).

The solder balls used here was manufactured by MITSUI MINING & SMELTING CO., LTD. Evaluation of solder ball spread (1) (referred to as evaluation (1) hereinbelow) was made using Sn63/Pb37 (weight ratio) solder balls with the peak temperature of 220° C., evaluation (2) was made using Sn/Ag2.9/Cu0.5 (weight ratio) solder balls with the peak temperature of 240° C., and evaluation (3) was made using Sn/Zn8.0/Bi3.0 (weight ratio) solder balls with the peak temperature of 230° C.

<Evaluation of Cleanability of Residue>

The flux was applied to a 50 mm×50 mm×1.6 mm comb-shaped substrate having a conductor width of 0.318 mm, a conductor spacing of 0.318 mm, and an overlap length of 15.75 mm. After the reflow, the substrate was soaked in D-limonene or deionized water adjusted to 30° C. for 5 minutes in ultrasonic waves, and dried. The substrate was visually observed, and the degree of residue was evaluated on three levels; (a) no residue was observed visually, (b) slight residue was observed, and (c) residue was clearly observed. The evaluation with D-limonene was identified as cleanability (1), and that with deionized water as cleanability (2).

<Evaluation of Insulation Performance>

An insulation resistance test was conducted in accordance with JIS Z 3197. Resistance of not lower than $10^{11}\Omega$ was indicated as (a), resistance not lower than $10^9\Omega$ and lower than $10^{11}\Omega$ was indicated as (b), and resistance lower than $10^9\Omega$ was indicated as (c).

TABLE 5

| | | Example | | | | | | | | |
|---|---|---|---|---|---|---|---|---|---|---|
| | | 1-1 | 1-2 | 1-3 | 1-4 | 1-5 | 1-6 | 1-7 | 1-8 | 1-9 |
| Composition | (R-1) | 16 | 72 | — | — | — | — | — | — | — |
| | (R-2) | — | — | 25 | — | — | — | 10 | 10 | 10 |
| in parts by weight | (P-1) | 18 | 18 | — | — | — | — | — | — | — |
| | (P-2) | — | — | — | 25 | — | — | — | — | — |
| | (S-1) | — | — | — | — | 25 | — | 15 | 15 | 15 |
| | (S-2) | — | — | — | — | — | 25 | — | — | — |
| | (A-1) | — | — | — | — | 5 | 5 | — | — | — |
| | (A-2) | — | — | 5 | 5 | — | — | 5 | 5 | 5 |
| | Castor wax | — | 6 | — | — | — | — | — | — | — |
| | Acid catalyst | — | — | — | — | — | — | — | 0.1 | — |
| | EPIOL SK | — | — | — | — | — | — | — | — | 5 |
| | Methyl ethyl ketone | 66 | — | — | — | — | — | — | — | — |
| | DEGHE | — | — | — | — | 70 | 70 | — | — | — |
| | BCA | — | 70 | 70 | 70 | — | — | 70 | 70 | 65 |
| Result of Evaluation | Evaluation (1) (%) | 85 | 85 | 90 | 89 | 89 | 89 | 89 | 90 | 89 |
| | Evaluation (2) (%) | 82 | 82 | 85 | 83 | 87 | 87 | 82 | 83 | 85 |
| | Evaluation (3) (%) | 12 | 15 | 80 | 8 | 85 | 85 | 11 | 12 | 80 |
| | Cleanability (1) | (a) | (a) | (a) | (a) | (a) | (a) | (a) | (a) | (a) |
| | Insulation Performance | (a) | (a) | (a) | (a) | (a) | (a) | (a) | (a) | (a) |

Examples 1-10 to 1-17

A flux having a composition shown in Table 6 was prepared, using each blocked carboxylic acid compound prepared in Synthesis Examples. The obtained flux was evaluated in the same way as in Examples 1-1 to 1-9. In Examples 1-14 and 1-17, the following evaluation of residue after reflow was made instead of the evaluation of cleanability. The results are shown in Table 6.

<Evaluation of Residue after Reflow>

The flux was applied to a substrate similar to the comb-shaped substrate used in the evaluation of cleanability, and subjected to reflow. Then the substrate was visually observed, and the degree of residue was evaluated on three levels as in the evaluation of the cleanability.

TABLE 6

| | | Example | | | | | | | |
|---|---|---|---|---|---|---|---|---|---|
| | | 1-10 | 1-11 | 1-12 | 1-13 | 1-14 | 1-15 | 1-16 | 1-18 |
| Composition in parts by weight | (P-3) | 90 | — | — | — | — | — | — | — |
| | (P-4) | — | 90 | — | — | — | — | — | — |
| | (S-1) | — | — | 25 | — | — | 25 | 25 | — |
| | (S-3) | — | — | — | 25 | — | — | — | — |
| | (S-4) | — | — | — | — | 25 | — | — | 25 |
| | (A-1) | 10 | 10 | 5 | 5 | 5 | 5 | 5 | 5 |
| | PEG4000 | — | — | — | — | — | 10 | — | — |
| | Acid catalyst | — | — | — | — | — | — | 0.1 | 0.1 |
| | TEG | — | — | 70 | 70 | — | 60 | 70 | — |
| | PMA | — | — | — | — | 70 | — | — | 70 |
| Result of Evaluation | Evaluation (1) (%) | 86 | 85 | 89 | 85 | 89 | 85 | 89 | 89 |
| | Evaluation (2) (%) | 81 | 80 | 87 | 84 | 89 | 85 | 87 | 89 |
| | Evaluation (3) (%) | 12 | 15 | 80 | 8 | 85 | 85 | 11 | 12 |
| | Residue after reflow | — | — | — | — | (a) | — | — | (a) |
| | Cleanability (2) | (a) | (a) | (a) | (a) | — | (a) | (a) | — |
| | Insulation Performance | (a) | (a) | (a) | (a) | (a) | (a) | (a) | (a) |

Comparative Examples 1-1 to 1-7

A flux was prepared using commercially available materials at a predetermined ratio as shown in Table 7. The obtained flux was subjected to the same evaluations as in Examples 1-1 to 1-17. The results are shown in Table 7.

TABLE 7

|  |  | Comparative Example | | | | | | |
|---|---|---|---|---|---|---|---|---|
|  |  | 1-1 | 1-2 | 1-3 | 1-4 | 1-5 | 1-6 | 1-7 |
| Composition in parts by weight | Natural rosin | 12 | — | 13 | 13 | — | — | — |
|  | Polymerized rosin | 4 | 25 | 12 | 12 | — | — | — |
|  | Hydrogenated rosin | 2 | — | — | — | — | — | — |
|  | PEG4000 | — | — | — | — | 50 | — | — |
|  | Glycerine | — | — | — | — | — | 50 | 100 |
|  | Adipic acid | 5 | 5 | 5 | — | 5 | — | — |
|  | Propylamine-HBr | — | — | — | 1 | — | 5 | — |
|  | 2-Propanol | 77 | 70 | 70 | 74 | — | — | — |
|  | TEG | — | — | — | — | 45 | 45 | — |
| Result of Evaluation | Evaluation (1) (%) | 85 | 85 | 84 | 86 | 75 | 77 | 60 |
|  | Evaluation (2) (%) | 82 | 76 | 72 | 80 | 65 | 60 | 46 |
|  | Evaluation (3) (%) | 10 | 10 | 13 | 20 | 5 | 4 | 0 |
|  | Residue after reflow | — | — | — | — | — | — | (a) |
|  | Cleanability (1) | (a) | (a) | (a) | (a) | — | — | — |
|  | Cleanability (2) | — | — | — | — | (b) | (a) | — |
|  | Insulation Performance | (a) | (b) | (b) | (c) | (b) | (a) | (a) |

Examples 2-1 to 2-23

A solder paste was prepared by kneading a flux having a composition shown in Tables 8 and 9 with fine pitch solder powder (solder powder type (1) (Sn63/Pb37 (weight ratio))), solder powder type (2) (Sn/Ag2.9/Cu0.5 (weight ratio)), or solder powder type (3) (Sn/Zn8/Bi3 (weight ratio)), having an average particle size of 25 μm and manufactured by MITSUI MINING AND SMELTING CO., LTD. The obtained solder paste was evaluated for wettability, solder ball test, void formation, insulation performance, storage stability, and cleanability of residue. The results are shown in Tables 8 and 9.

<Evaluation of Wettability>

The test was conducted in accordance with JIS Z 3284, Appendix 10. The evaluation was made on the following 1 to 4 scale of spread.
1: Solder melted from the solder paste wetted the test plate, so that the solder spread into the area that was larger than the area to which the solder paste was originally applied.
2: The whole area to which the solder paste was originally applied was wet with solder.
3: Most of the area to which the solder paste was originally applied was wet with solder (including the dewetted state).
4: No wetting of the test plate with solder was observed, and the molten solder formed one or more solder balls (non-wetted state).

<Solder Ball Test (Degree of Solder Coalescence)>

The test was conducted in accordance with JIS Z 3284, Appendix 11. The evaluation was made on the following 1 to 4 scale of spreading.
1: Solder powder was molten to form one large ball, without any solder balls therearound.
2: Solder powder was molten to form one large ball, with not more than three solder balls having a diameter of not larger than 75 μm arranged therearound.
3: Solder powder was molten to form one large ball, with not less than four solder balls having a diameter of not larger than 75 μm arranged therearound but not in a semi-continuous halo.
4: Solder powder was molten to form one large ball, with a number of smaller solder balls arranged therearound in a semi-continuous halo.
5: Other than 1 to 4.

<Evaluation of Void Formation (Reliability of Joint)>

The solder paste was printed on a 60 mm² copper plate in six 6 mm-diameter patterns through a metal mask of 150 μm thick, and reflowed under an air atmosphere. Then the copper plate with the solder was cut with a cutter, and the soldered portion was observed under a microscope for void formation. The six patterns were measured for voids of 10 μm or larger. The solder pastes having the average number of voids of less than two per pattern were indicated as passed, and those having the average number of voids of two or more per pattern were indicated as failed.

<Insulation Performance>

An insulation resistance test was conducted in accordance with JIS Z 3284. Resistance of not lower than $10^{11}\Omega$ was indicated as (a), resistance not lower than $10 9\Omega$ and lower than $10^{11}\Omega$ was indicated as (b), and resistance lower than $10^9\Omega$ was indicated as (c).

<Evaluation of Storage Stability>

An accelerated test was conducted by storing the produced solder paste at 25° C. for 7 days, and evaluation was made based on the ratio of the viscosity of the paste immediately after production to the viscosity after the accelerated test as an index. The conditions of the accelerated test generally correspond to cold storage at 5° C. for three months. The viscosity was measured using a spiral viscometer manufactured by MALCOM CO., LTD. under the conditions for the spiral method in accordance with JIS Z 3284.

<Evaluation of Cleanability of Residue>

The solder paste was applied to a 50 mm×50 mm×1.6 mm comb-shaped substrate having a conductor width of 0.318 mm, a conductor spacing of 0.318 mm, and an overlap length of 15.75 mm. After the reflow, the substrate was soaked in a cleaning liquid adjusted to 30° C. for 5 minutes in ultrasonic waves, and dried. The substrate was visually observed, and the degree of residue was evaluated on three levels. The oscillating frequency of the ultrasonic waves was 38 kHz.

The substrates with no residue observed visually were indicated as (a), those with slight residue observed were indicated as (b), those with residue clearly observed were indicated as (c). The evaluation with D-limonene was identified as cleanability (1), that with deionized water as cleanability (2), and that with deionized water/isopropanol (80/20 by volume ratio) as cleanability (3).

<Evaluation of Residue after Reflow>

The solder paste was applied to a substrate similar to the comb-shaped substrate used in the evaluation of cleanability, and subjected to reflow. Then the substrate was visually observed, and the degree of reside was evaluated in the same way as in the evaluation of the cleanability.

TABLE 8

| | | Example | | | | | | | | | | | |
|---|---|---|---|---|---|---|---|---|---|---|---|---|---|
| | | 2-1 | 2-2 | 2-3 | 2-4 | 2-5 | 2-6 | 2-7 | 2-8 | 2-9 | 2-10 | 2-11 | 2-12 |
| Flux composition in parts by weight | (R-1) | 6 | 6 | 6 | — | — | — | — | — | — | — | — | — |
| | (R-2) | — | — | — | 6 | — | — | — | — | — | 2 | 2 | 2 |
| | (P-1) | 2 | — | — | — | — | — | — | — | — | — | — | — |
| | (P-2) | — | — | — | — | 6 | — | — | — | — | — | — | — |
| | (S-1) | — | — | — | — | — | 7 | 7 | 7 | — | 5 | 5 | 5 |
| | (S-2) | — | — | — | — | — | — | — | — | 7 | — | — | — |
| | (A-1) | — | 2 | 2 | — | — | 0.5 | 0.5 | 0.5 | 0.5 | — | — | — |
| | (A-2) | — | — | — | 2 | 2 | — | — | — | — | 1 | 1 | 1 |
| | Castor wax | 0.8 | 0.8 | 0.8 | — | — | — | — | — | — | — | — | — |
| | Hydrogenated castor oil | — | — | — | 1 | — | 1 | 1 | 1 | 1 | 1 | 1 | 1 |
| | Acid catalyst | — | — | — | — | — | — | — | — | — | 0.1 | 0.1 | 0.1 |
| | EPIOL SK | — | — | — | — | — | — | — | — | — | — | — | 1 |
| | Benzotriazole | — | — | — | — | — | — | — | — | — | 0.5 | 0.5 | 0.5 |
| | 2-Propanol | 1.2 | 1.2 | 1.2 | — | — | — | — | — | — | — | — | — |
| | DEGHE | — | — | — | — | — | 2 | 2 | 2 | 2 | — | — | — |
| | BCA | — | — | — | 1 | 1 | — | — | — | — | 1 | 1 | — |
| Type of solder powder | | (2) | (3) | (1) | (2) | (2) | (1) | (2) | (3) | (3) | (2) | (3) | (2) |
| Amount of solder powder (parts by weight) | | 90 | 90 | 90 | 90 | 90 | 90 | 90 | 90 | 90 | 90 | 90 | 90 |
| Result of Evaluation | Wettability | 1 | 2 | 2 | 1 | 1 | 1 | 1 | 1 | 1 | 1 | 1 | 1 |
| | Solder ball test | 1 | 1 | 1 | 1 | 1 | 1 | 1 | 1 | 1 | 1 | 1 | 1 |
| | Void formation | passed | passed | passed | passed | passed | passed | passed | passed | passed | passed | passed | passed |
| | Insulation Performance Initial | (a) | (a) | (a) | (a) | (a) | (a) | (a) | (a) | (a) | (a) | (a) | (a) |
| | After 100 hrs | (a) | (a) | (a) | (a) | (a) | (a) | (a) | (a) | (a) | (a) | (a) | (a) |
| | Storage stability (Pa·s) Initial | 230 | 235 | 245 | 231 | 236 | 480 | 500 | 520 | 550 | 225 | 230 | 229 |
| | After 100 hrs | 240 | 236 | 249 | 235 | 238 | 490 | 520 | 550 | 570 | 226 | 235 | 235 |
| | Viscosity Increase Ratio | 1.04 | 1.01 | 1.02 | 1.02 | 1.01 | 1.02 | 1.04 | 1.06 | 1.04 | 1.00 | 1.02 | 1.03 |
| | Residue cleanability (1) | (a) | (a) | (a) | (a) | (a) | (a) | (a) | (a) | (a) | (a) | (a) | (a) |

TABLE 9

| | | Example | | | | | | | | | | |
|---|---|---|---|---|---|---|---|---|---|---|---|---|
| | | 2-13 | 2-14 | 2-15 | 2-16 | 2-17 | 2-18 | 2-19 | 2-20 | 2-21 | 2-22 | 2-23 |
| Flux composition in parts by weight | (P-3) | 8.5 | 8.5 | 8.5 | — | — | — | — | — | — | — | — |
| | (S-2) | — | — | — | 7 | 7 | 7 | — | — | 6 | 6 | 6 |
| | (S-3) | — | — | — | — | — | — | 7 | — | — | — | — |
| | (S-4) | — | — | — | — | — | — | — | 7 | — | — | — |
| | (A-1) | 1 | 1 | 1 | 0.5 | 0.5 | 0.5 | 0.5 | 0.5 | 0.5 | 0.5 | 0.5 |
| | PEG 4000 | 0.5 | 0.5 | 0.5 | — | — | — | — | — | — | — | — |
| | PEG 6000 | — | — | — | 1 | 1 | 1 | 1 | — | 1 | 1 | 1 |
| | Trimethylolpropane | — | — | — | — | — | — | — | 1 | — | — | — |
| | Acid catalyst | — | — | — | — | — | — | — | — | 0.1 | 0.1 | 0.1 |
| | Benzotriazole | — | — | — | — | — | — | — | — | 0.5 | 0.5 | 0.5 |
| | TEG | — | — | — | 2 | 2 | 2 | 2 | — | 2 | 2 | 2 |
| | Butyl carbitol | — | — | — | — | — | — | — | 2 | — | — | — |
| Type of solder powder | | (1) | (2) | (3) | (1) | (2) | (3) | (2) | (2) | (1) | (2) | (3) |
| Amount of solder powder (parts by weight) | | 90 | 90 | 90 | 90 | 90 | 90 | 90 | 90 | 90 | 90 | 90 |
| Result of Evaluation | Wettability | 1 | 1 | 1 | 1 | 1 | 1 | 1 | 1 | 1 | 1 | 1 |
| | Solder ball test | 1 | 1 | 1 | 1 | 1 | 1 | 1 | 1 | 1 | 1 | 1 |
| | Void formation | passed | passed | passed | passed | passed | passed | passed | passed | passed | passed | passed |
| | Insulation Performance Initial | (a) | (a) | (a) | (a) | (a) | (a) | (a) | (a) | (a) | (a) | (a) |
| | After 100 hrs | (a) | (a) | (a) | (a) | (a) | (a) | (a) | (a) | (a) | (a) | (a) |
| | Storage stability (Pa·s) Initial | 230 | 235 | 245 | 400 | 430 | 470 | 490 | 395 | 225 | 230 | 229 |
| | After 100 hrs | 240 | 236 | 249 | 420 | 460 | 500 | 520 | 420 | 226 | 235 | 235 |
| | Viscosity Increase Ratio | 1.04 | 1.01 | 1.02 | 1.05 | 1.07 | 1.06 | 1.06 | 1.06 | 1.00 | 1.02 | 1.03 |
| | Residue after reflow | — | — | — | — | — | — | — | (a) | — | — | — |
| | Residue cleanability (1) | (a) | (a) | (a) | (a) | (a) | (a) | (a) | — | (a) | (a) | (a) |

Comparative Examples 2-1 to 2-9

A solder paste was prepared by mixing and kneading commercially available materials and one of the various solder powders at a predetermined ratio as shown in Table 10. The obtained solder paste was subjected to the same evaluations as in Examples 2-1 to 2-23. The results are shown in Table 10.

Incidentally, the viscosity after 100 hours as evaluation of the storage stability in Comparative Examples 2-4 and 2-7 was too high to be measured.

solder at about 240° C., and dried with a fan. As a result, each connecting terminal of the components of the circuit was excellently soldered with solder 34 by flow soldering as shown in FIG. 3(b).

Example 3-3

The flux prepared in Example 1-17 was applied to wiring of a Ag- or Cu-based thick film provided on a ceramic substrate. As illustrated in FIG. 4, substrate 40 was vertically immersed

TABLE 10

| | | Comparative Example | | | | | | | | |
|---|---|---|---|---|---|---|---|---|---|---|
| | | 2-1 | 2-2 | 2-3 | 2-4 | 2-5 | 2-6 | 2-7 | 2-8 | 2-9 |
| Flux composition in parts by weight | Natural rosin | 2.5 | — | — | — | — | — | — | — | — |
| | Polymerized rosin | 2.5 | 6 | 6 | 6 | — | — | — | — | — |
| | PEG 1000 | — | — | — | — | 6 | 6 | 6 | — | — |
| | Tetraethylene glycol | — | — | — | — | — | — | — | 9 | — |
| | Glycerine | — | — | — | — | — | — | — | — | 9 |
| | Adipic acid | 0.6 | 1 | 1 | 1 | 1 | 1 | 1 | — | — |
| | Castor wax | 0.8 | — | — | — | — | — | — | — | — |
| | Hydrogenated castor oil | — | 1 | 1 | 1 | — | — | — | — | — |
| | Hydroxyethyl cellulose | — | — | — | — | 1 | 1 | 1 | — | — |
| | Trimethylol propane | — | — | — | — | — | — | — | 1 | 1 |
| | DEGHE | 3.5 | 2 | 2 | 2 | — | — | — | — | — |
| | TEG | — | — | — | — | 2 | 2 | 2 | — | — |
| Type of solder powder | | (2) | (1) | (2) | (3) | (1) | (2) | (3) | (2) | (2) |
| Amount of solder powder (parts by weight) | | 90 | 90 | 90 | 90 | 90 | 90 | 90 | 90 | 90 |
| Result of Evaluation | Wettability | 1 | 1 | 2 | 4 | 2 | 3 | 4 | 4 | 4 |
| | Solder ball test | 2 | 2 | 4 | 5 | 3 | 4 | 5 | 5 | 5 |
| | Void formation | passed | passed | failed | failed | failed | failed | failed | failed | failed |
| | Insulation Initial | (b) | (b) | (b) | (b) | (b) | (b) | (b) | (a) | (a) |
| | Performance After 100 hrs | (b) | (b) | (b) | (b) | (b) | (b) | (b) | (a) | (a) |
| | Storage Initial | 400 | 400 | 450 | 500 | 420 | 470 | 530 | 390 | 420 |
| | stability After 100 hrs | 490 | 490 | 610 | — | 490 | 670 | — | 420 | 450 |
| | (Pa · s) Viscosity Increase Ratio | 1.02 | 1.02 | 1.04 | — | 1.17 | 1.43 | — | 1.08 | 1.07 |
| | Residue after reflow | — | — | — | — | — | — | — | (a) | (a) |
| | Residue cleanability (1) | (b) | (a) | (a) | — | — | — | — | — | — |
| | Residue cleanability (3) | — | — | — | — | (b) | (b) | — | — | — |

Example 3-1

Figure 2:
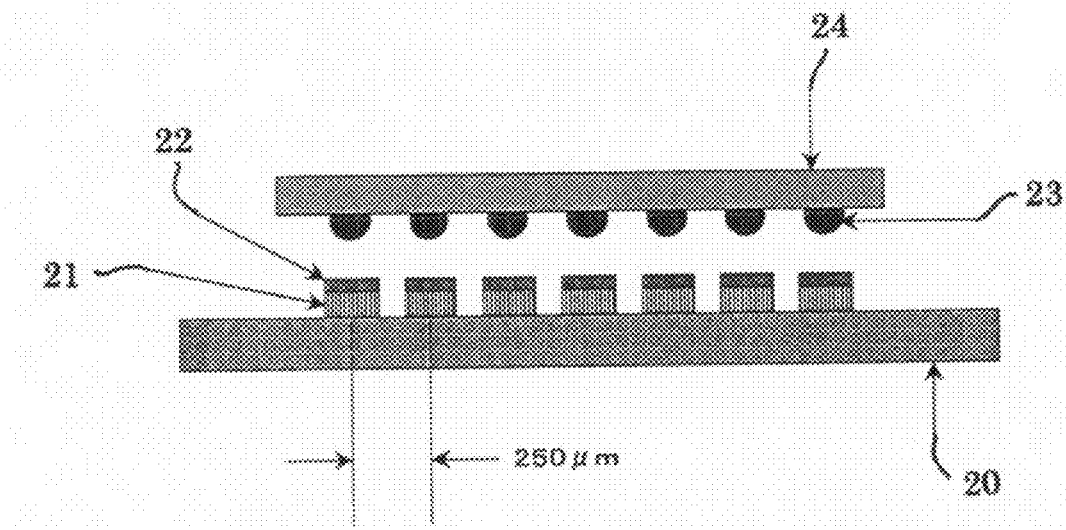
FIG. 2 is an explanatory schematic view illustrating the process for mounting a flip chip IC in Example 3-1.

As shown in FIG. 2, each flux 21 prepared in Examples 1-1 to 1-17 was applied thinly to a wiring pattern formed on ceramic substrate 20 with Cu conductor 21 at 250 μm pitch. Flip chip IC 23 provided with solder bumps 22 at 250 μm pitch (provided with 224 bumps) was mounted on the wiring using a high precision mounter. Electrodes of the flip chip IC 23 were formed by soldering Sn/Ag3.0/Cu0.5 (weight ratio) on Cu bumps. After the mounting, the assembly was subjected to reflow in the air at the peak temperature of about 245° C. As a result, all of the fluxes provided good soldering even at such a fine pitch as 250 μm.

Example 3-2

An Example of a soldering method by means of flow soldering in a flow process is shown in FIG. 3. Shrink-type IC 31 having terminal 1a, chip component 32 such as a ceramic capacitor having electrodes 2a, and circuit component 33 having component terminals 33a were temporarily bonded to substrate 30 as shown in FIG. 3(a), and each flux prepared in Examples 1-1 to 1-17 was applied over the entire rear surface of the substrate 30. Then the substrate 30 was subjected to pre-heating step at about 150° C., passed through a flow soldering chamber to be brought into contact with a molten into vessel 41 containing molten solder 41a of a composition Sn/Ag2.0/Pb36.0 (weight ratio) maintained at about 235° C. After about two-second immersion, the substrate 40 was drawn out of the molten solder at an angle of about 45 degrees with respect to the liquid level, with a little material left on its surface. Subsequently, the substrate 40 was again vertically immersed in the vessel 41 for about three seconds, and slowly drawn out at an angle of about 45 degrees with respect to the liquid level. With some materials, little flux remained on the substrate surface, and the solder was excellently applied to the substrate 40 thus dipped, irrespective of the shape and size of the lands thereon. Even if remained, the material was in a trace amount, and removable with ethanol or the like, or decomposed and evaporated in the subsequent mounting of the components and reflow, leaving no residue in the end. Thus no-clean soldering was realized.

Figure 5:
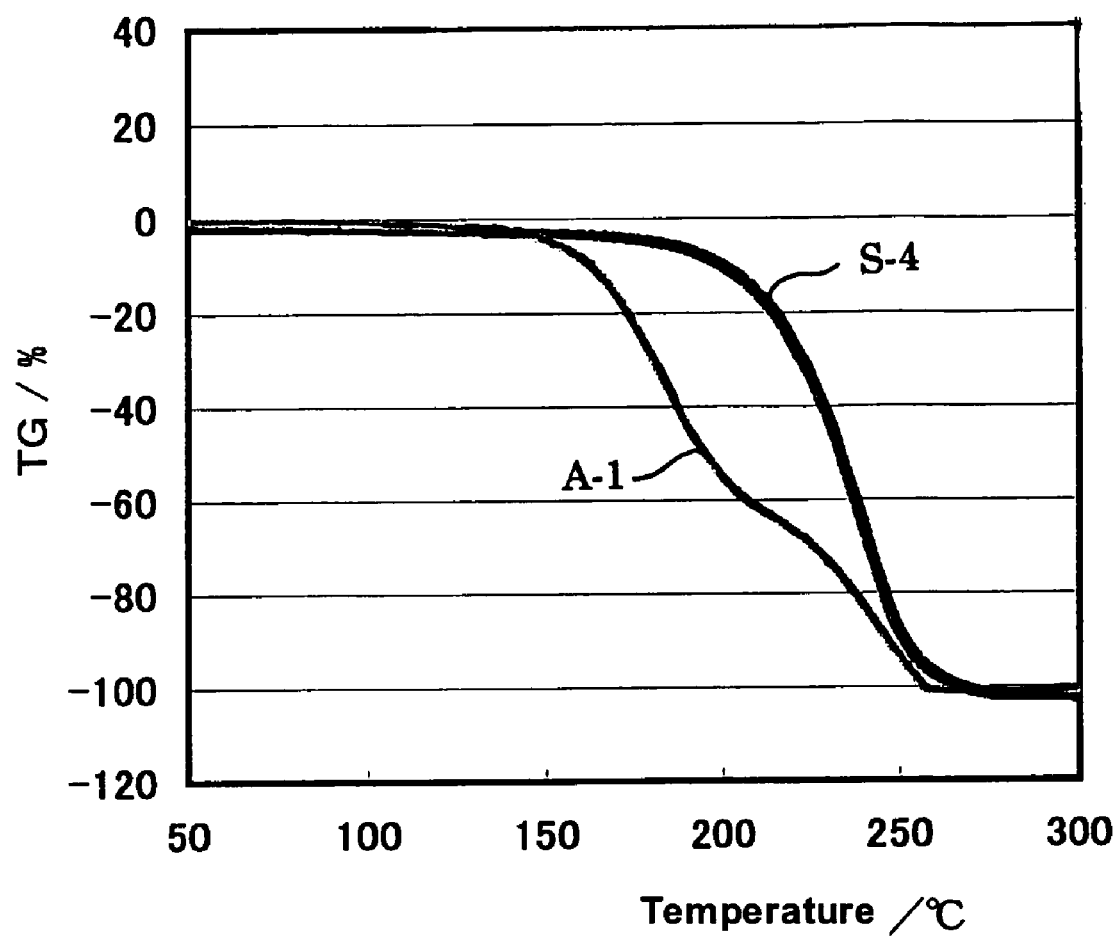
FIG. 5 is a graph showing the results of the thermogravimetric analysis of (S-4) and (A-1) used in the flux prepared in Example 1-17.

The results of thermogravimetric analysis of (S-4) and (A-1) used in the flux prepared in Example 1-17 are shown in FIG. 5. From this figure, it is understood that (S-4) and (A-1) reached 100% weight loss near 250° C., and thus the flux with these materials leaves substantially no residue after reflow.

Example 3-4

Each solder paste prepared in Examples 2-1 to 2-23 was printed on desired positions on wiring provided on a substrate, and an LSI, a chip resistor, and a chip capacitor were placed on the solder paste. The assembly was heated with a reflow heat source for soldering. A hot blast stove was used as the reflow heat source. With the Sn63/Pb37 (weight ratio) solder paste, the reflow conditions included the pre-heat temperature of 130° C., the pre-heating duration of 65 seconds, the top temperature of 220° C., and the holding time at 200° C. or higher of 30 seconds. With the Sn/Ag2.9/Cu0.5 (weight ratio) solder paste, the reflow conditions included the pre-heat temperature of 150 to 170° C., the pre-heating duration of 110 seconds, the top temperature of 245° C., and the holding time at 200° C. or higher of 50 seconds. With the Sn/Zn8.0/Bi3.0 (weight ratio) solder paste, the reflow conditions included the pre-heat temperature of 140 to 160° C., the pre-heating duration of 65 seconds, the top temperature of 230° C., and the holding time at 200° C. or higher of 30 seconds. After the reflow, the substrate was cooled. It was observed that the reflow soldering was in success.

What is claimed is:

1. A method of soldering comprising the steps of:
   (A) providing a flux composition on an electrode portion of a substrate,
   said flux composition comprising at least one compound having at least one blocked carboxyl group selected from the group consisting of:
   compound (Y) obtained by reaction of a carboxylic acid anhydride compound and a hydroxy vinyl ether compound, and
   compound (Z) obtained by reaction of an acid anhydride and a polyhydric alcohol, followed by addition polymerization with a divinyl ether compound,
   wherein said flux composition is free from a compound having two or more reactive functional groups in a molecule capable of forming chemical bonds with carboxyl groups, and
   wherein said flux composition is non-curing;
   (B) providing a solder bumped electronic component;
   (C) placing said electronic component provided in step (B) on said substrate obtained in step (A) and
   (D1) subjecting the substrate with the electronic component obtained in step (C) to reflow for mounting.

2. A method of soldering comprising the steps of:
   (A) providing a flux composition on an electrode portion of a substrate,
   said flux composition comprising at least one compound having at least one blocked carboxyl group selected from the group consisting of:
   compound (Y) obtained by reaction of a carboxylic acid anhydride compound and a hydroxy vinyl ether compound, and
   compound (Z) obtained by reaction of an acid anhydride and a polyhydric alcohol, followed by addition polymerization with a divinyl ether compound,
   wherein said flux composition is free from a compound having two or more reactive functional groups in a molecule capable of forming chemical bonds with carboxyl groups, and
   wherein said flux composition is non-curing; and
   (D2) supplying solder onto the substrate with the flux composition obtained in step (A), by flowing or dipping.

3. A method of soldering comprising the steps of:
   (X) printing a solder paste on an electrode portion of a substrate,
   said solder paste comprising a flux composition and solder powder,
   wherein said flux composition comprises at least one compound having at least one blocked carboxyl group selected from the group consisting of:
   compound (Y) obtained by reaction of a carboxylic acid anhydride compound and a hydroxy vinyl ether compound, and
   compound (Z) obtained by reaction of an acid anhydride and a polyhydric alcohol, followed by addition polymerization with a divinyl ether compound,
   wherein said flux composition is free from a compound having two or more reactive functional groups in a molecule capable of forming chemical bonds with carboxyl groups, and
   wherein said flux composition is non-curing;
   (Y) placing an electronic component on said substrate obtained in step (X); and
   (Z) subjecting said substrate with the electronic component obtained in step (Y) to reflow for mounting.

4. The method of claim 1, wherein said compound (Y) has an acid number of not larger than 20 mgKOH/g and a weight average molecular weight of 300 to 100000, and said compound (Z) has an acid number of not larger than 10 mgKOH/g and a weight average molecular weight of 500 to 500000.

5. The method of claim 4, wherein said compound (Y) is represented by the formula (3), and said compound (Z) is represented by the formula (4):

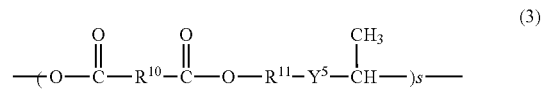

wherein $R^{10}$ is a substituted or unsubstituted divalent aliphatic or aromatic group having 1 to 50 carbon atoms, $R^{11}$ is a divalent hydrocarbon group or glycol residue having 1 to 50 carbon atoms, $Y^5$ is an oxygen or sulfur atom, and s is an integer of 1 to 500;

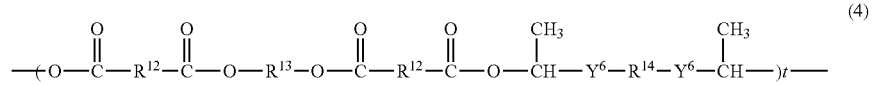

wherein $R^{12}$, $R^{13}$ and $R^{14}$ each independently is a divalent organic residue, $Y^6$ is an oxygen or sulfur atom, and t is an integer of 1 to 500.

6. The method of claim 1, wherein said flux composition further comprises a at least one member selected from the group consisting of a latent heat catalyst, a photocatalyst, an activator, a thixotropic agent, an antioxidant, a rust preventive agent, and a solvent.

7. The method of claim 1, wherein said flux composition further comprises a compound having one reactive functional group in a molecule capable of forming a chemical bond with a carboxyl group upon heating.

8. The method of claim 2, wherein said compound (Y) has an acid number of not larger than 20 mgKOH/g and a weight average molecular weight of 300 to 100000, and said compound (Z) has an acid number of not larger than 10 mgKOH/g and a weight average molecular weight of 500 to 500000.

9. The method of claim 8, wherein said compound (Y) is represented by the formula (3), and said compound (Z) is represented by the formula (4):

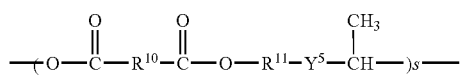
(3)

wherein $R^{10}$ is a substituted or unsubstituted divalent aliphatic or aromatic group having 1 to 50 carbon atoms, $R^{11}$ is a divalent hydrocarbon group or glycol residue having 1 to 50 carbon atoms, $Y^5$ is an oxygen or sulfur atom, and s is an integer of 1 to 500;

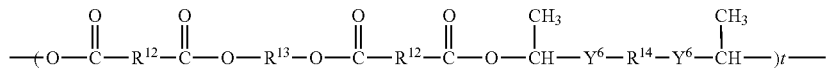
(4)

wherein $R^{12}$, $R^{13}$, and $R^{14}$ each independently is a divalent organic residue, $Y^6$ is an oxygen or sulfur atom, and t is an integer of 1 to 500.

10. The method of claim 2, wherein said flux composition further comprises a at least one member selected from the group consisting of a latent heat catalyst, a photocatalyst, an activator, a thixotropic agent, an antioxidant, a rust preventive agent, and a solvent.

11. The method of claim 2, wherein said flux composition further comprises a compound having one reactive functional group in a molecule capable of forming a chemical bond with a carboxyl group upon heating.

12. The method of claim 3, wherein said compound (Y) has an acid number of not larger than 20 mgKOH/g and a weight average molecular weight of 300 to 100000, and said compound (Z) has an acid number of not larger than 10 mgKOH/g and a weight average molecular weight of 500 to 500000.

13. The method of claim 12, wherein said compound (Y) is represented by the formula (3), and said compound (Z) is represented by the formula (4):

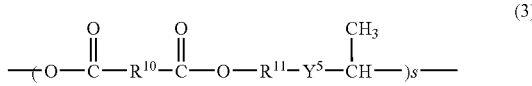
(3)

wherein $R^{10}$ is a substituted or unsubstituted divalent aliphatic or aromatic group having 1 to 50 carbon atoms, $R^{11}$ is a divalent hydrocarbon group or glycol residue having 1 to 50 carbon atoms, $Y^5$ is an oxygen or sulfur atom, and s is an integer of 1 to 500;

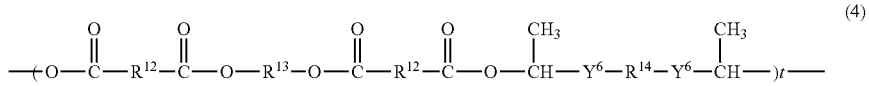
(4)

wherein $R^{12}$, $R^{13}$, and $R^{14}$ each independently is a divalent organic residue, $Y^6$ is an oxygen or sulfur atom, and t is an integer of 1 to 500.

14. The method of claim 3, wherein said flux composition further comprises a at least one member selected from the group consisting of a latent heat catalyst, a photocatalyst, an activator, a thixotropic agent, an antioxidant, a rust preventive agent, and a solvent.

15. The method of claim 3, wherein said flux composition further comprises a compound having one reactive functional group in a molecule capable of forming a chemical bond with a carboxyl group upon heating.

* * * * *